US 11,349,698 B2

(12) United States Patent
Huang et al.

(10) Patent No.: US 11,349,698 B2
(45) Date of Patent: May 31, 2022

(54) QUADRATURE AMPLITUDE MODULATION QAM SIGNAL MODULATION METHOD AND APPARATUS, AND QUADRATURE AMPLITUDE MODULATION QAM SIGNAL DEMODULATION METHOD AND APPARATUS

(71) Applicant: HUAWEI TECHNOLOGIES CO., LTD., Guangdong (CN)

(72) Inventors: Yuanda Huang, Dongguan (CN); Kexin Xiao, Shanghai (CN); Bin Xia, Shanghai (CN)

(73) Assignee: Huawei Technologies Co., Ltd., Shenzhen (CN)

(*) Notice: Subject to any disclaimer, the term of this patent is extended or adjusted under 35 U.S.C. 154(b) by 0 days.

(21) Appl. No.: 17/357,605

(22) Filed: Jun. 24, 2021

(65) Prior Publication Data
US 2021/0320835 A1   Oct. 14, 2021

Related U.S. Application Data

(63) Continuation of application No. PCT/CN2019/128102, filed on Dec. 24, 2019.

(30) Foreign Application Priority Data

Dec. 26, 2018   (CN) .......................... 201811616616.6

(51) Int. Cl.
*H04L 27/36*        (2006.01)
*H04L 1/00*         (2006.01)

(52) U.S. Cl.
CPC ............ *H04L 27/36* (2013.01); *H04L 1/0041* (2013.01)

(58) Field of Classification Search
CPC ............................. H04L 27/36; H04L 1/0041
See application file for complete search history.

(56) References Cited

U.S. PATENT DOCUMENTS

| 2013/0170571 A1 | 7/2013 | Barsoum et al. |
| 2016/0309342 A1 | 10/2016 | Barsoum et al. |
| (Continued) | | |

FOREIGN PATENT DOCUMENTS

| CN | 104821871 A | 8/2015 |
| CN | 107566312 A | 1/2018 |
| (Continued) | | |

OTHER PUBLICATIONS

Buchali et al., "Probabilistically Shaped QAM for Independent Reach, Spectral Efficiency and Bit-rate Adaptation," 42nd European Conference and Exhibition on Optical Communications, Sep. 2016, 3 pages.

(Continued)

*Primary Examiner* — Freshteh N Aghdam
(74) *Attorney, Agent, or Firm* — Fish & Richardson P.C.

(57) ABSTRACT

The present disclosure relates to modulation methods. One example method includes performing distribution matching (DM) encoding on N1 first bits to obtain N2 first symbols, determining N4 to-be-phase-modulated symbols whose signal powers are equal to a preset signal power from the N2 first symbols, performing phase modulation on the N4 to-be-phase-modulated symbols based on N3 second bits to obtain N4 second symbols, performing binary labeling (BL) encoding on the N4 second symbols and N2-N4 first symbols to obtain N5 BL encoded output bits, performing forward error correction (FEC) encoding on the N5 BL encoded output bits to obtain N6 FEC redundant bits, and performing quadrature amplitude modulation (QAM) map- (Continued)

ping based on the N6 FEC redundant bits and the N5 BL encoded output bits to obtain N2 target QAM signals.

20 Claims, 9 Drawing Sheets

(56) References Cited

U.S. PATENT DOCUMENTS

| | | | |
|---|---|---|---|
| 2016/0316382 A1 | 10/2016 | Barsoum et al. | |
| 2018/0176041 A1 | 6/2018 | Yue et al. | |
| 2019/0109752 A1* | 4/2019 | Zhang | H04B 10/616 |
| 2019/0149390 A1* | 5/2019 | Torbatian | H04L 25/067 |
| | | | 375/298 |
| 2019/0158238 A1* | 5/2019 | Lefevre | H04L 27/3411 |
| 2019/0280809 A1* | 9/2019 | Cho | H04B 10/2543 |
| 2019/0342031 A1* | 11/2019 | Böcherer et al. | H04L 1/0045 |
| 2021/0266097 A1* | 8/2021 | Huang | H04N 7/22 |

FOREIGN PATENT DOCUMENTS

| | | |
|---|---|---|
| CN | 108242972 A | 7/2018 |
| CN | 108631879 A | 10/2018 |
| EP | 3306884 A1 | 4/2018 |
| EP | 3605906 A1 | 2/2020 |
| WO | 2018114410 A1 | 6/2018 |

OTHER PUBLICATIONS

Chen, "Research and Design of Multilevel Coded Modulation for High Order Modulation Optical Transmission System," Beijing University of Posts and Telecommunications, Mar. 2018, 2 pages (with English abstract).
Office Action issued in Chinese Application No. 201811616616.6 dated May 28, 2021, 10 pages (with English translation).
PCT International Search Report and Written Opinion issued in International Application No. PCT/CN2019/128102 dated Mar. 12, 2020, 17 pages (with English translation).
Shi et al., "Probabilistically Shaped 1024-QAM OFDM Transmission in an IM-DD System," OSA Technical Digest (online) (Optical Society of America, 2018), Mar. 2018, 3 pages.
Bocherer et al, "High Throughput Probabilistic Shaping with Product Distribution Matching," arXiv: 1702.07510v1, Feb. 24, 2017, 10 pages.
Extended European Search Report issued in European Application No. 19902651.9 dated Jan. 7, 2022, 10 pages.

* cited by examiner

QUADRATURE AMPLITUDE MODULATION QAM SIGNAL MODULATION METHOD AND APPARATUS, AND QUADRATURE AMPLITUDE MODULATION QAM SIGNAL DEMODULATION METHOD AND APPARATUS

CROSS-REFERENCE TO RELATED APPLICATIONS

This application is a continuation of International Application No. PCT/CN2019/128102, filed on Dec. 24, 2019, which claims priority to Chinese Patent Application No. 201811616616.6, filed on Dec. 26, 2018. The disclosures of the aforementioned applications are hereby incorporated by reference in their entireties.

TECHNICAL FIELD

The present disclosure relates to the communications field, and in particular, to a quadrature amplitude modulation QAM signal modulation method and apparatus, and a quadrature amplitude modulation QAM signal demodulation method and apparatus.

BACKGROUND

As service requirements for the mobile internet and the internet of things increase, emerging services such as an ultra-high-definition video and virtual reality (VR) develop rapidly. As a result, a requirement for a transmission network capacity increases. Therefore, how to achieve higher-rate modulation and demodulation technologies to improve a network transmission capacity becomes a hot spot for current researches.

In the prior art, with development of modulation and demodulation technologies, a quadrature amplitude modulation (QAM) system (hereinafter referred to as a PS-QAM system) based on probabilistic shaping (PS) is proposed. In comparison with a conventional QAM system, in the modulation-demodulation system, spectral efficiency is improved and a transmission capability is greatly improved. In the PS-QAM system, the probabilistic shaping mainly includes two steps: distribution matching (DM) coding and binary labeling (BL) encoding. However, a current DM encoding process is very complex, and a mapping depth of the current DM encoding process sharply increases as an input data volume increases. Consequently, modulation and demodulation processes of the existing PS-QAM system are complex, and have poor efficiency and applicability.

SUMMARY

Embodiments of the present disclosure provide a QAM signal modulation method and apparatus, and a QAM signal demodulation method and apparatus, to improve efficiency and applicability of a QAM signal modulation method and a QAM signal demodulation method that are based on probability shaping.

According to a first aspect, an embodiment of the present disclosure provides a QAM signal modulation method. First, distribution matching DM encoding is performed on N1 first bits, to obtain N2 first symbols. Herein, signal powers corresponding to the N2 first symbols include at least a first power and a second power, and this is not limited. N4 to-be-phase-modulated symbols whose signal powers are equal to a preset signal power are determined from the N2 first symbols, and phase modulation is performed on the N4 to-be-phase-modulated symbols based on N3 second bits, to obtain N4 second symbols. Herein, some or all of signal powers corresponding to the N2 first symbols are equal to the preset signal power. In other words, the preset signal power may be used as a signal power corresponding to each of all or some of the N2 first symbols. Binary labeling BL encoding is performed on the N4 second symbols and N2-N4 first symbols in the N2 first symbols except the N4 to-be-phase-modulated symbols, to obtain N5 BL encoded output bits. Then, forward error correction (FEC) encoding is performed on the N5 BL encoded output bits, to obtain N6 FEC redundant bits. Finally, quadrature amplitude modulation QAM mapping is performed based on the N6 FEC redundant bits and the N5 BL encoded output bits, to obtain N2 target QAM signals.

In this embodiment of the present disclosure, in a process of QAM signal modulation based on probability shaping, DM encoding is combined with easy-to-implement phase modulation to replace a manner of directly performing DM encoding. When same bit data is modulated, in comparison with a direct DM encoding process, a DM encoding process based on a combination of DM encoding and phase modulation enables a smaller mapping depth and much lower complexity. Therefore, a QAM signal modulation method based on probability shaping is less complex, and highly efficient and applicable.

In a feasible implementation, the following phase modulation operations may be performed on any to-be-phase-modulated symbol i in the N4 to-be-phase-modulated symbols: obtaining a bit quantity Ti of a target phase modulation bit corresponding to the to-be-phase-modulated symbol i; determining, from the N3 second bits based on a target location of the to-be-phase-modulated symbol i in the N4 to-be-phase-modulated symbols and the bit quantity Ti, the target phase modulation bits j corresponding to the to-be-phase-modulated symbol i, where the target phase modulation bits j includes Ti second bits; determining, based on the target phase modulation bit j, a target phase s corresponding to the to-be-phase-modulated symbol i from a target phase set corresponding to the to-be-phase-modulated symbol i; and performing phase modulation on the to-be-phase-modulated symbol i based on the target phase s, to obtain a second symbol corresponding to the to-be-phase-modulated symbol i. Based on a second symbol obtained by performing the phase modulation operations on each of the N4 to-be-phase-modulated symbols, the N4 second symbols corresponding to the N4 to-be-phase-modulated symbols are determined. In this implementation, phase modulation is performed on the N4 to-be-phase-modulated bits based on the N3 second bits. A process is simple and easy to implement. In this case, the N1 first bits and the N3 second bits are modulated. In addition, this avoids high complexity caused by directly performing DM encoding, and can improve efficiency and applicability of a QAM signal modulation method that is based on probability shaping.

In a feasible implementation, before phase modulation is performed on the N4 to-be-phase-modulated symbols based on the N3 second bits, N31 phase modulation bits on which modulation is to be performed can be obtained, and phase bit encoding can be performed on the N31 phase modulation bits, to obtain the N3 second bits. N4 target phase modulation bits can be directly determined based on The N3 second bits. Specifically, when a quantity D of types of target phases included in the target phase set is not equal to a power of 2, if a target phase modulation bit is directly formed by a plurality of phase modulation bits, it is very probable that a quantity of formed target phase modulation bits does not match the quantity of types of target phases. Therefore, when the N4 target phase modulation bits cannot be directly obtained from an obtained to-be-modulated bitstream (that is, the N31 phase modulation bits), phase bit encoding may be first performed to obtain the N3 second bits. In this way, the target phase modulation bits determined based on the N3 second bits are in a one-to-one correspondence with the N4 target phases. This avoids a case in which two or more target phase modulation bits correspond to one target phase. Therefore, data resources are not wasted, and phase modulation is less complex.

In a feasible implementation, when distribution matching DM encoding is performed on the N1 first bits, a quantity N3 of second bits used for phase modulation may be determined based on the preset signal power.

In a feasible implementation, a quantity N4 of to-be-phase-modulated symbols may be determined based on the preset signal power and signal powers corresponding to symbols output through DM encoding. Then, a bit quantity of a target phase modulation bit corresponding to each of the N4 to-be-phase-modulated symbols is determined. Herein, the target phase modulation bit is used to determine a target phase corresponding to the to-be-phase-modulated symbol from a preset target phase set, and to-be-phase-modulated symbols having different signal powers correspond to different target phase sets. Finally, the quantity N3 of the second bits used for phase modulation is determined based on the quantity N4 of to-be-phase-modulated symbols and the bit quantity of the target phase modulation bit corresponding to each of the N4 to-be-phase-modulated symbols.

In a feasible implementation, the following operations for determining the bit quantity of the target phase modulation bit may be performed on any to-be-phase-modulated symbol i in the N4 to-be-phase-modulated symbols: determining a quantity D of types of phases in the target phase set corresponding to the to-be-phase-modulated symbol i; and determining, based on the quantity D of types of phases, the bit quantity of the target phase modulation bit corresponding to the to-be-phase-modulated symbol i, where the target phase modulation bit includes one or more second bits that are in the N3 second bits and that are used to determine a target phase corresponding to a specific to-be-phase-modulated symbol, and the bit quantity of the target phase modulation bit is equal to a value obtained by rounding up $\log_2(D)$; and obtaining, by performing, on each of the N4 to-be-phase-modulated symbols, the operations for determining the bit quantity of the target phase modulation bit, the bit quantity of the target phase modulation bit corresponding to the to-be-phase-modulated symbol. The bit quantity of the target phase modulation bit corresponding to the to-be-phase-modulated symbol is directly determined based on the quantity D of types of phases. The method is simple and easy to implement, and can reduce design complexity of the entire modulation method.

In a feasible implementation, forward error correction FEC encoding may be further performed based on N7 quadrant selection bits and the N5 BL encoded output bits, to obtain the N6 FEC redundant bits.

In a feasible implementation, N8 target quadrant selection bits may be determined based on the N6 FEC redundant bits and the N7 quadrant selection bits. Herein, N8=N6+N7. Then, quadrature amplitude modulation QAM mapping is performed on the N5 BL encoded output bits based on the N8 target quadrant selection bits, to obtain the N2 target QAM signals.

In a feasible implementation, after the N2 target QAM signals are determined, the N2 target QAM signals are sent.

In this embodiment of the present disclosure, in a process of QAM signal modulation based on probability shaping, DM encoding is combined with easy-to-implement phase modulation to replace a manner of directly performing DM encoding. When same bit data is modulated, in comparison with a direct DM encoding process, a DM encoding process based on a combination of DM encoding and phase modulation enables a smaller mapping depth and much lower complexity. Therefore, a QAM signal modulation method based on probability shaping is less complex, and highly efficient and applicable.

According to a second aspect, an embodiment of the present disclosure provides a QAM signal demodulation method. First, QAM demapping is performed on N2 QAM signals, to obtain N9 QAM demapped bits. Herein, the N9 QAM demapped bits include at least N6 FEC redundant bits. Then. FEC decoding is performed on the N9 QAM demapped bits, to obtain N10 FEC decoded bits. Herein, the N10 FEC decoded bits include at least N5 BL encoded output bits. BL decoding is performed on the N5 BL encoded output bits, to obtain N2 BL decoded symbols; Power decision is performed on the N2 BL decoded symbols, to obtain N2 first symbols corresponding to the N2 BL decoded symbols. Herein, one to-be-BL-encoded symbol corresponds to one first symbol. DM decoding is performed on the N2 first symbols based on a preset DM encoding mapping relationship, to obtain N1 first bits. N4 second symbols whose signal powers are equal to a preset signal power are determined from the N2 BL decoded symbols, and phase demodulation is performed on the N4 second symbols, to obtain N3 second bits. Herein, signal powers corresponding to the N2 first symbols include at least a first power and a second power, and some or all of signal powers corresponding to the N2 first symbols are equal to the preset signal power.

According to this embodiment of the present disclosure, in a demodulation process corresponding to QAM signal modulation that is based on probability shaping, phase demodulation is combined with DM decoding to replace a manner of directly performing DM decoding. This reduces complexity of a DM decoding process in the demodulation process, reduces complexity of the demodulation process corresponding to the QAM signal modulation that is based on probability shaping, and enables faster demodulation speed and higher applicability.

In a feasible implementation, the following phase demodulation operation may be performed on any second symbol p in the N4 second symbols whose signal powers are equal to the preset signal power: performing phase demodulation on the second symbol p to obtain a target phase modulation bit corresponding to the second symbol p. Herein, the target phase modulation bit is used to determine a phase corresponding to the second symbol p from a preset target phase set, a bit quantity of the target phase modulation bit is not less than 1, and second symbols having different signal powers correspond to different bit quantities of target phase modulation bits. Then, N4 target phase modulation bits obtained by performing the phase demodulation operation on each of the N4 second symbols whose signal powers are equal to the preset signal power is determined as the N3 second bits. One target phase modulation bit includes at least one second bit.

In some feasible implementations, phase bit decoding may be performed on the N3 second bits, to obtain N31 phase modulation bits.

In some feasible implementations, the N10 FEC decoded bits further include N7 quadrant selection bits.

In some feasible implementations, the N2 QAM signals may be further received before QAM demapping is performed on the N2 QAM signals.

According to a third aspect, an embodiment of the present disclosure provides a QAM signal modulation apparatus. The apparatus includes units configured to perform the QAM signal modulation method provided in any possible implementation of the first aspect, and therefore can also achieve beneficial effects (or advantages) of the QAM signal modulation method provided in the first aspect.

According to a fourth aspect, an embodiment of the present disclosure provides a QAM signal demodulation apparatus. The apparatus includes units configured to perform the QAM signal demodulation method provided in any possible implementation of the second aspect, and therefore can also achieve beneficial effects (or advantages) of the QAM signal modulation method provided in the second aspect.

According to a fifth aspect, an embodiment of the present disclosure provides a network device. The network device includes a processor and a memory, and the processor and the memory are interconnected. The memory is configured to store a computer program, the computer program includes a program instruction. The processor is configured to invoke the program instruction to perform the QAM signal modulation method provided in the first aspect, and therefore can also achieve beneficial effects of the QAM signal modulation method provided in the first aspect.

According to a sixth aspect, an embodiment of the present disclosure provides a network device. The network device includes a processor and a memory, and the processor and the memory are interconnected. The memory is configured to store a computer program, the computer program includes a program instruction. The processor is configured to invoke the program instruction to perform the QAM signal demodulation method provided in the second aspect, and therefore can also achieve beneficial effects of the QAM signal demodulation method provided in the second aspect.

According to a seventh aspect, an embodiment of the present disclosure provides a computer-readable storage medium. The computer-readable storage medium stores an instruction. When the instruction is run on a computer, the computer is enabled to perform the QAM signal modulation method provided in any possible implementation of the first aspect, and therefore can also achieve beneficial effects of the QAM signal modulation method provided in the first aspect.

According to an eighth aspect, an embodiment of the present disclosure provides a computer-readable storage medium. The computer-readable storage medium stores an instruction. When the instruction is run on a computer, the computer is enabled to perform the QAM signal demodulation method provided in any possible implementation of the second aspect, and therefore can also achieve beneficial effects of the QAM signal demodulation method provided in the second aspect.

According to a ninth aspect, an embodiment of the present disclosure provides a chip, and the chip is coupled to a transceiver in a network device, to perform the technical solution provided in the first aspect of some embodiments of the present disclosure.

According to a tenth aspect, an embodiment of the present disclosure provides a chip, and the chip is coupled to a transceiver in a network device, to perform the technical solution provided in the second aspect of some embodiments of the present disclosure.

According to an eleventh aspect, an embodiment of the present disclosure provides a chip system. The chip system includes a processor, configured to support a terminal device in implementing a function in the first aspect, for example, generating or processing information in the QAM signal modulation method provided in the first aspect. In a possible design, the chip system further includes a memory, and the memory is configured to store a program instruction and data that are necessary for the terminal device. The chip system may include a chip, or may include a chip and another discrete component.

According to a twelfth aspect, an embodiment of the present disclosure provides a chip system. The chip system includes a processor, configured to support a terminal device in implementing a function in the second aspect, for example, generating or processing information in the QAM signal demodulation method provided in the second aspect. In a possible design, the chip system further includes a memory, and the memory is configured to store a program instruction and data that are necessary for the terminal device. The chip system may include a chip, or may include a chip and another discrete component.

According to a thirteenth aspect, an embodiment of the present disclosure provides a computer program product including an instruction, and when the computer program product is run a computer, the computer is enabled to perform the QAM signal modulation method provided the first aspect, and therefore can also achieve beneficial effects of the QAM signal modulation method provided in the first aspect.

According to a fourteenth aspect, an embodiment of the present disclosure provides a computer program product including an instruction, and when the computer program product is run a computer, the computer is enabled to perform the QAM signal demodulation method provided the second aspect, and therefore can also achieve beneficial effects of the QAM signal demodulation method provided in the second aspect.

DESCRIPTION OF EMBODIMENTS

The following clearly and completely describes the technical solutions in some embodiments of the present disclosure with reference to the accompanying drawings in some embodiments of the present disclosure.

Figure 1:
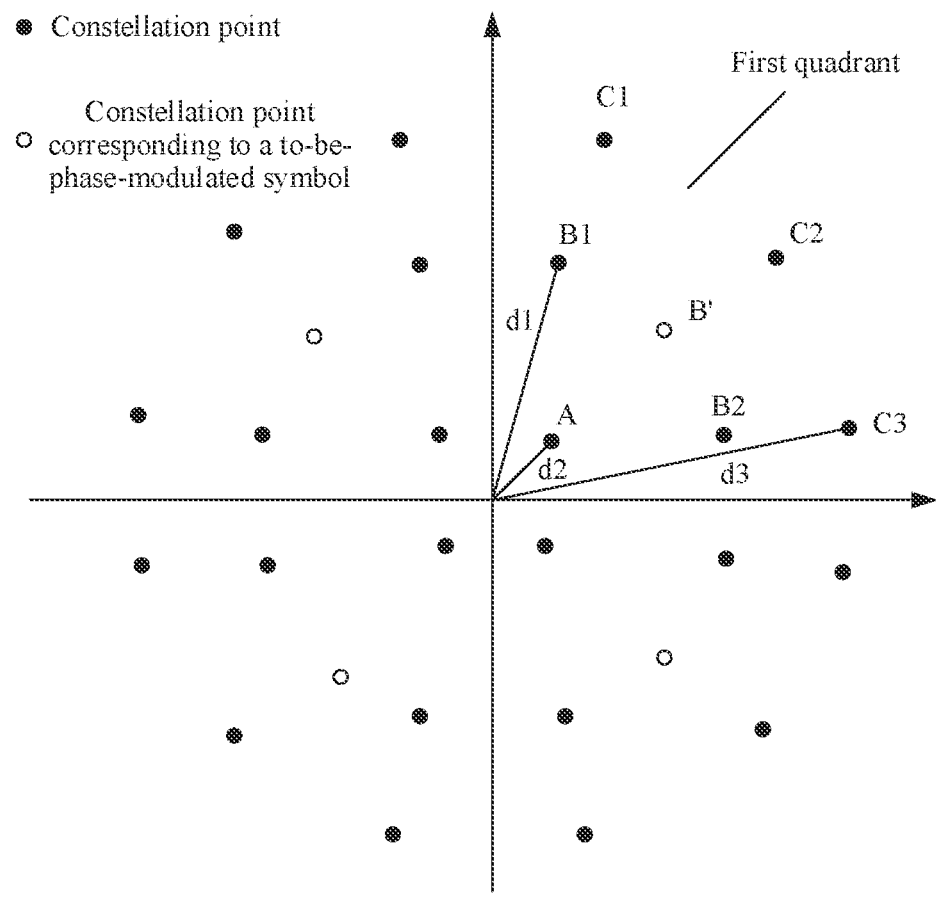
FIG. 1 is a target constellation diagram according to an embodiment of the present disclosure.

A QAM signal modulation method provided in some embodiments of the present disclosure is used to modulate bit data that needs to be transmitted, to obtain a target QAM signal corresponding to a predesigned target constellation diagram. A QAM signal demodulation method provided in some embodiments of the present disclosure is used to demodulate one or more target QAM signals corresponding to a target constellation diagram, to obtain bit data that needs to be transmitted. FIG. 1 is a target constellation diagram according to an embodiment of the present disclosure. The target constellation diagram is represented in a rectangular coordinate system. A horizontal axis may indicate an 1 component (that is, an in-phase component) corresponding to a QAM signal, and a vertical axis may indicate a Q component (that is, a quadrature component) corresponding to the QAM signal. It can be learned from the figure that the constellation diagram is a constellation diagram with 24 constellation points, which may be briefly referred to as a 24 QAM constellation diagram. The following uses a first quadrant as an example to describe the target constellation diagram. In FIG. 1, the first quadrant includes six constellation points: A, B1, B2, C1, C2, and C3. In the figure, B' is a constellation point corresponding to a to-be-phase-modulated symbol (that is, a constellation point corresponding to a symbol that is output through DM encoding and that is not phase-modulated). Distances (for example, d1, d2, and d3) between constellation points and the origin of the coordinate axes indicate signal powers of QAM signals corresponding to the constellation points. In FIG. 1, the constellation points in the first quadrant may be classified into constellation points of three powers based on different signal powers. For example, a constellation point of a first power includes a constellation point A. Constellation points of a second power include the constellation points B1 and B2. Constellation points of a third power include the constellation points C1, C2, and C3. An included angle between the horizontal axis and a line connecting each constellation point to the origin of the rectangular coordinate system indicates a phase of a QAM signal corresponding to the constellation point.

In some embodiments of the present disclosure, for example, "first" and "second" in a first bit and a second bit are only used to distinguish one or more different bits, and do not constitute another limitation. Similarly, "first" and "second" in subsequent terms, namely, a first symbol and a second symbol, do not constitute another limitation either.

Embodiment 1

Figure 2:
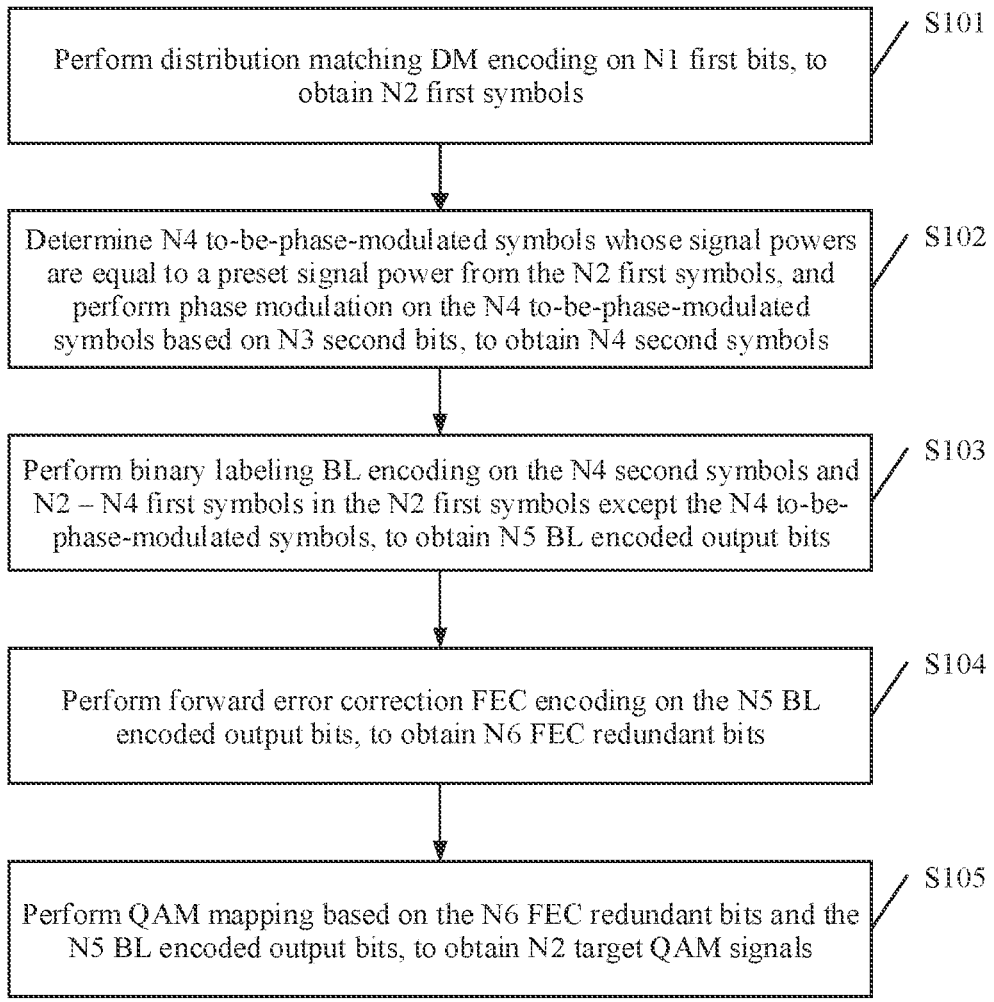
FIG. 2 is a schematic flowchart of a QAM signal modulation method according to an embodiment of the present disclosure.

FIG. 2 is a schematic flowchart of a QAM signal modulation method according to an embodiment of the present disclosure. The method may be performed by a network device having a QAM signal modulation function, such as an optical transceiver. For ease of understanding and description, the network device is used as an execution body in this embodiment for description. In this embodiment, the entire QAM signal modulation method is described by using an example in which one or more QAM signals corresponding to one or more constellation points in the first quadrant in FIG. 1 are obtained through modulation. The method includes the following steps.

S101. Perform distribution matching DM encoding on N1 first bits, to obtain N2 first symbols.

In some feasible implementations, the network device may perform DM encoding on the N1 first bits, to encode the N1 first bits to obtain the N2 first symbols. Herein, signal powers corresponding to the N2 first symbols include at least a first power and a second power, and the first power and the second power herein are the same as the signal powers of the QAM signals corresponding to the constellation points in FIG. 1. In addition, it should be noted that a main function of DM encoding is to encode an input equiprobable bitstream to obtain a plurality of non-equiprobable symbols. A probability distribution corresponding to a signal power of each of the plurality of non-equiprobable symbols is preset. Therefore, for a first symbol f in the N2 first symbols, a probability that a signal power of the first symbol f is equal to the first power is different from a probability that a signal power of the first symbol f is equal to the second power. For example, the probability that the signal power of the symbol f is equal to the first power is 60%, and the probability that the signal power of the symbol f is equal to the second power is 40%.

In specific implementation, the network device may first obtain, from an internal memory of the network device or an external storage device connected to the network device, the N1 first bits on which QAM signal modulation needs to be performed. Then, the network device may perform DM encoding on the N1 first bits based on a preset DM encoding mapping relationship, to obtain the N2 first symbols. A probability distribution corresponding to a signal power of each of the N2 first symbols satisfies a preset probability distribution. It should be noted that, according to a design principle of DM encoding, there is a fixed constraint relationship between the probability distribution of the signal power corresponding to the first symbol output through DM encoding, a quantity N2 of the first symbols, and a quantity N1 of the first bits. For example, it is assumed that N2 is equal to 10, and in 10 first symbols, a percentage of first symbols whose signal power is equal to the first power is 40%, and a percentage of first symbols whose signal power is equal to the second power is 60%. In this case, there may be C (10, 4) combination manners, that is, a total of 210 combination manners, for the 10 first symbols based on different signal powers. One combination manner corresponds to one manner of combination formed by a plurality of first bits. In this case, a quantity of input bits may equal to a value obtained by rounding down $\log_2(210)$. To be specific, the quantity N1 of the first bits herein is equal to 7.

S102: Determine N4 to-be-phase-modulated symbols whose signal powers are equal to a preset signal power from the N2 first symbols, and perform phase modulation on the N4 to-be-phase-modulated symbols based on N3 second bits, to obtain N4 second symbols.

In some feasible implementations, after obtaining the N2 first symbols, the network device may select N4 first symbols from the N2 first symbols based on the preset signal power, and determine the N4 first symbols as the N4 to-be-phase-modulated symbols. Herein, the preset signal power may be used as a signal power corresponding to each of all or some of the N2 first symbols. Then, the network device may further obtain the N3 second bits, and perform phase modulation on the N4 to-be-phase-modulated symbols based on the N3 second bits, to obtain N4 phase-modulated second symbols. Herein, one to-be-phase-modulated symbol corresponds to one second symbol. The N3 second bits are mainly used to determine a phase (that is, a target phase below) to which each of the N4 to-be-phase-modulated symbols is to be modulated.

In specific implementation, after obtaining the N2 first symbols, the network device may obtain the preset signal power. Then, the network device may perform power decision on each of the N2 first symbols, to determine a signal power corresponding to the first symbol. For example, the network device may calculate an actual signal power of a first symbol q, and then determine whether the actual signal power of the first signal q falls within a decision range corresponding to the first power. The decision range corresponding to the first power is determined based on the first power and a preset error value. For example, assuming that the first power is a, and the preset error value is ±b, the decision range corresponding to the first power is [a−b, a+b]. If determining that the signal power corresponding to the first symbol q falls within the decision range corresponding to the first power, the network device may determine that the signal power corresponding to the first symbol is equal to the first power, in other words, the signal power corresponding to the first symbol q is a. If determining that the signal power corresponding to the first symbol q does not fall within the decision range corresponding to the first power, the network device may continue to determine whether the signal power corresponding to the first symbol q falls within a decision range corresponding to another power. For a specific process, refer to the foregoing description, and details are not described herein again. After determining the signal power corresponding to each of the N2 first symbols, the network device may determine, as the N4 to-be-phase-modulated symbols, the N4 first symbols that are in the N2 first symbols and whose signal powers are equal to the preset signal power. Herein, it should be noted that, a probability distribution of the signal power corresponding to each of the N2 first symbols output through DM encoding is fixed, and therefore after the quantity N2 of the first symbols output through DM encoding is determined, a value of a quantity N4 of the to-be-phase-modulated symbols is also fixed, and does not change in an encoding process.

Optionally, in specific implementation, the preset signal power may be determined based on a predesigned target constellation diagram. Herein, referring to FIG. 1, in the 24 QAM constellation diagram (that is, the target constellation diagram) shown in FIG. 1, signal powers of QAM signals corresponding to the constellation points B1 and B2 are the second signal power, and signal powers of QAM signals corresponding to the constellation points C1. C2, and C3 are the third signal power. After obtaining the 24 QAM constellation diagram, the network device may determine that the constellation points B1 and B2 may be obtained by rotating a constellation point (for example, B' in the figure) whose signal power is equal to the first power. The constellation points C1 and C3 may be obtained by rotating a constellation point (for example, C2 in the figure). Therefore, the network device may determine, based on the target constellation diagram, that preset signal powers include the second signal power and the third signal power.

In some feasible implementations, after determining the N4 to-be-phase-modulated symbols, the network device may obtain the N3 second bits from the internal memory of the network device or the external storage device connected to the network device. Then, the network device determines, based on the N3 second bits, N4 target phase modulation bits corresponding to the N4 to-be-phase-modulated symbols. The target phase modulation bit herein is used to determine a unique target phase corresponding to a to-be-phase-modulated symbol from a target phase set corresponding to the N4 to-be-phase-modulated symbols. One target phase modulation bit may include one or more second bits. It should be noted that if to-be-phase-modulated symbols correspond to different signal powers, the to-be-phase-modulated symbols correspond to different target phase sets. In other words, if the preset signal power includes only the second power, the N4 to-be-phase-modulated symbols correspond to one target phase set. If the preset signal powers include the second power and the third power, the N4 to-be-phase-modulated symbols correspond to two target phase sets, and so on. Details are not described herein again.

Phase modulation processes of the N4 to-be-phase-modulated symbols are described below by using a phase modulation process of any to-be-phase-modulated symbol i in the N4 to-be-phase-modulated symbols as an example. Herein, it is assumed that the N4 to-be-phase-modulated symbols correspond to one target phase set Y and the target phase set Y includes D types of target phases. After obtaining the N3 second bits, the network device may obtain a bit quantity Ti of a target phase modulation bit corresponding to the to-be-phase-modulated symbol i. In specific implementation, the bit quantity Ti of the target phase modulation bit may be determined based on a quantity D of types of target phases, and the bit quantity Ti may be equal to a value obtained by rounding up $\log_2(D)$. For example, it is assumed that the quantity of types of target phases is 5, and a value obtained by rounding up $\log_2(5)$ is 3, in other words, the bit quantity Ti is 3. Then, the network device may obtain a target location of the to-be-phase-modulated symbol i in the N4 to-be-phase-modulated symbols. Specifically, the target location may be a sequence number of the to-be-phase-modulated symbol i in the N4 to-be-phase-modulated symbols. For example, the target location of the to-be-phase-modulated symbol i may take a value of 4. In other words, the to-be-phase-modulated symbol i is the fourth symbol in the N4 target to-be-phase-modulated symbols. Then, the network device may obtain Ti second bits from the target location of the sequence, namely, the N3 second bits, and determine the Ti second bits as the target phase modulation bit j corresponding to the to-be-phase-modulated symbol i. Then, the network device may determine, based on the target phase modulation bit j and a preset correspondence between a target phase modulation bit and a target phase, a target phase s corresponding to the to-be-phase-modulated symbol i from the target phase set corresponding to the to-be-phase-modulated symbol i. For example, it is assumed that the target phase set includes four types of target phases: s1, s2, s3, and s4, and the four types of target phases correspond to four target bits: 00, 01, 10, and 11 respectively. If the network device determines that the target phase modulation bit j corresponding to the to-be-phase-modulated symbol i is 11, the network device may determine that the target phase corresponding to the to-be-phase-modulated symbol i is s4. After determining the target phase s corresponding to the to-be-phase-modulated symbol i, the network device may perform phase modulation on the to-be-phase-modulated symbol i, to obtain a second symbol corresponding to the to-be-phase-modulated symbol i. A phase of the second symbol is the target phase s. Likewise, the network device repeats the foregoing operations, to obtain the N4 second symbols corresponding to the N4 to-be-phase-modulated symbols.

Optionally, in specific implementation, when there are two or more types of preset signal powers, the N4 to-be-phase-modulated symbols may correspond to a plurality of target phase sets. The following uses an example in which the preset signal powers include the second power and the third power, in other words, the N4 to-be-phase-modulated symbols correspond to a first target phase set and a second target phase set. In this case, the N3 second bits include N31 second bits and N32 second bits. After obtaining the N3 second bits, the network device may first determine a signal power corresponding to the to-be-phase-modulated symbol i. When determining that the signal power corresponding to the to-be-phase-modulated symbol i is equal to the second power, the network device may determine, based on a quantity of types of phases in the first target phase set, a bit quantity Ti of a target phase modulation bit corresponding to the to-be-phase-modulated symbol i. Then, the network device determines the target phase modulation bit j corresponding to the to-be-phase-modulated symbol i from the N31 second bits, and performs phase modulation on the to-be-phase-modulated symbol i based on the target phase modulation bit j. For a specific process, refer to the foregoing process of performing phase modulation on the to-be-phase-modulated symbol i based on the target phase modulation bit j, and details are not described herein again. When determining that the signal power corresponding to the to-be-phase-modulated symbol i is equal to the third power, the network device may determine, based on a quantity of types of phases in the second target phase set, a bit quantity Ti of a target phase modulation bit corresponding to the to-be-phase-modulated symbol i. Then, the network device determines the target phase modulation bit j corresponding to the to-be-phase-modulated symbol i from the N32 second bits, and performs phase modulation on the to-be-phase-modulated symbol i based on the target phase modulation bit j. For a specific process, refer to the foregoing process of performing phase modulation on the to-be-phase-modulated symbol i based on the target phase modulation bit j, and details are not described herein again.

Preferably, in specific implementation, the N3 second bits may be obtained by the network device by performing phase bit encoding on the obtained N31 phase modulation bits. It should be noted that, when the quantity D of types of target phases included in the target phase set is not equal to a power of 2, if a target phase modulation bit is directly formed by combining a plurality of phase modulation bits, it is very probable that a quantity of target phase modulation bits formed through combination does not match the quantity of types of target phases. For example, a target phase set includes three types of phases: s1, s2, and s3. If two phase modulation bits are directly combined to form a target to-be-phase-modulated symbol, there are four combination manners: 00, 01, 10, and 11. However, the four combination manners cannot one-to-one match the three types of target phases. Consequently, a specific combination manner cannot be fully used, and data resources are wasted. Therefore, the network device needs to perform phase bit encoding on the N31 phase modulation bits, to obtain the N3 second bits. In this way, target phase modulation bits determined based on the N3 second bits one-to-one correspond to the N4 target phases, and data resources are not wasted. For example, it is assumed that the network device obtains 10 phase modulation bits, for example, a bit sequence 1011001110. A target phase set corresponding to the to-be-phase-modulated symbol includes three types of phases: s1, s2, and s3. The network device may first shift the 10 phase modulation bits to obtain a bit sequence 0101100111, and then perform an AND operation on the bit sequence 1011001110 and the bit sequence 0101100111, to obtain a bit sequence 0001000110. Finally, each bit in the bit sequence 1011001110 is combined with a bit at a corresponding location in the bit sequence 0001000110. For example, a first bit in the bit sequence 1011001110 is combined with a first bit in the bit sequence 0001000110, and a total of 10 bit combinations may be obtained (in other words, 10 target phase modulation bits are obtained). The 10 bit combinations include 10, 00, 10, 11, 00, 00, 10, 11, 11, and 00. The foregoing 10 bit combinations include only three combination types: 00, 01, and 11. The three combination types one-to-one correspond to the target phases s1, s2, and s3 respectively. This can avoid a case in which the target phase modulation bit does not one-to-one match the target phase.

In some feasible implementations, when performing parameter initialization for an encoding process, the network device may determine, based on the preset signal power, a quantity N3 of second bits used for phase modulation. Optionally, in specific implementation, the network device may determine, based on the preset signal power and signal powers corresponding to preset symbols output through DM encoding, the quantity N4 of the to-be-phase-modulated symbols. For example, it is preset that 10 symbols are output through DM encoding, where there are two symbols whose signal powers are equal to the first power, three symbols whose signal powers are equal to the second power, and five symbols whose signal powers are equal to the third power. After obtaining the preset signal powers (herein, it is assumed that the preset signal powers include the second power and the third power), the network device may determine eight to-be-phase-modulated symbols from the 10 symbols based on the preset signal powers. Then, the network device may determine, based on a quantity D of types of target phases in a target phase set corresponding to each of the to-be-phase-modulated symbols, a bit quantity of a target phase modulation bit corresponding to the to-be-phase-modulated symbol. Specifically, any to-be-phase-modulated symbol i in the N4 to-be-phase-modulated symbols is used as an example. The network device may determine a quantity D of types of phases in a target phase set corresponding to the to-be-phase-modulated symbol i. Then, the network device determines, based on the quantity D of types of phases, a bit quantity of a target phase modulation bit corresponding to the to-be-phase-modulated symbol i. The bit quantity of the target phase modulation bit is equal to a value obtained by rounding up $\log_2(D)$. The bit quantity of the target phase modulation bit corresponding to the to-be-phase-modulated symbol is directly determined based on the quantity D of types of phases. The method is simple and easy to implement, and can reduce design complexity of the entire modulation method. Finally, the network device determines the quantity N3 of the second bits used for phase modulation, based on the quantity N4 of the to-be-phase-modulated symbols and the bit quantity of the target phase modulation bit corresponding to each of the to-be-phase-modulated symbols.

S103: Perform binary labeling BL encoding on the N4 second symbols and N2-N4 first symbols in the N2 first symbols except the N4 to-be-phase-modulated symbols, to obtain N5 BL encoded output bits.

In some feasible implementations, after obtaining the N4 to-be-phase-modulated symbols, the network device may perform binary labeling BL encoding on the N4 second symbols and the N2-N4 first symbols in the N2 first symbols except the N4 to-be-phase-modulated symbols, to obtain the N5 BL encoded output bits. In specific implementation, the network device may determine, based on types of signal powers corresponding to the N2 first symbols, a quantity of bits obtained after each symbol is mapped. For example, it is assumed that the signal powers corresponding to the N2 first symbols include the first power, the second power, and the third power. In this case, signal powers corresponding to the N4 second symbols and the N2-N4 first symbols in the N2 first symbols except the N4 to-be-phase-modulated symbols also include the first signal power, the second signal power, and the third signal power. Therefore, the network device needs to map each symbol to two bits. For example, a symbol corresponding to the first power is mapped to 00, a symbol corresponding to the second power is mapped to 01, and a symbol corresponding to the third power is mapped to 11. Only in this way, the N2 symbols can one-to-one correspond to the BL encoded output bits obtained after BL encoding is performed on the N2 symbols.

S104: Perform forward error correction FEC encoding on the N5 BL encoded output bits, to obtain N6 FEC redundant bits.

In some feasible implementations, after obtaining the N5 BL encoded output bits, the network device may perform FEC encoding on the N5 BL encoded output bits, to obtain the N6 FEC redundant bits. Herein, a quantity of the FEC redundant bits is determined based on a mapping relationship corresponding to FEC encoding.

Optionally, in specific implementation, the network device may further obtain N7 quadrant selection bits. The N7 quadrant selection bits may be used to perform quadrant selection for constellation points obtained through QAM mapping in a subsequent QAM mapping process. After obtaining the N7 quadrant selection bits, the network device may perform FEC encoding on the N5 BL encoded output bits and the N7 quadrant selection bits, to obtain the N6 FEC redundant bits. Herein, there is a fixed constraint relationship between a quantity N5 of the BL encoded output bits, a quantity N7 of the quadrant selection bits, and a quantity N6 of the FEC redundant bits, that is, N5=N6+N7.

S105: Perform QAM mapping based on the N6 FEC redundant bits and the N5 BL encoded output bits, to obtain N2 target QAM signals.

In some feasible implementations, after obtaining the N6 FEC redundant bits and the N5 BL encoded output bits, the network device may perform QAM mapping based on the N6 FEC redundant bits and the N5 BL encoded output bits, to obtain the N2 target QAM signals.

Optionally, in specific implementation, when only the N5 BL encoded output bits need to be mapped to QAM signals corresponding to constellation points in a quadrant in the target constellation diagram, the network device may first map the N5 N5 BL encoded output bits onto a complex plane, to form N2 complex-valued modulation symbol. A real part of a mathematical expression corresponding to each complex-valued modulation symbol may correspond to a horizontal coordinate, namely, an I component or in-phase component, in the target constellation diagram. An imaginary part of the mathematical expression corresponding to the complex-valued modulation symbol may correspond to a vertical coordinate, namely, a Q component or quadrature component, in the target constellation diagram. Then, the network device may modulate the I component and the Q component of each complex-valued modulation symbol onto two orthogonal carriers, to obtain the N2 target QAM signals corresponding to the N5 BL encoded output bits. In addition, the network device may modulate the N6 FEC redundant bits into a plurality of QAM signals. In this way, after demodulation is subsequently performed, N6 error correction bits can be obtained, to perform error correction on a plurality of first bits and a plurality of second bits obtained after the demodulation.

Optionally, in specific implementation, when the N5 BL encoded output bits need to be mapped to QAM signals corresponding to constellation points in quadrants in the target constellation diagram, the network device may determine the N7 quadrant selection bits and the N6 FEC redundant bits as N8 target quadrant selection bits. Herein, N8=N7+N6. Then, the network device may map the N5 BL encoded output bits to N2 QAM signals. For a specific process, refer to the foregoing process of mapping the N5 BL encoded output bits to the N2 target QAM signals. Details are not described herein again. Then, the network device may determine, based on the N8 target quadrant selection bits, a location of a constellation point that corresponds to each of the N2 QAM signals and that is in a quadrant of the target constellation diagram, to obtain the N2 target QAM signals. Herein, it should be noted that, a quantity of target quadrant selection bits required for determining a quadrant in which a constellation point corresponding to a QAM signal is located is determined based on a quantity of types of quadrants in the target constellation diagram. For example, if the quantity of types of quadrants is equal to m, the quantity of required target quadrant selection bits may equal to a value obtained by rounding up $\log_2(m)$.

Optionally, after determining the N2 target QAM signals, the network device may send the N2 target QAM signals. For example, in a specific implementation scenario of optical signal transmission, the network device may first perform electrical-to-optical conversion on the N2 target QAM signals, to obtain optical signals corresponding to the N2 target QAM signals. Then, the network device may send, over a preset channel, the optical signals corresponding to the N2 target QAM signals.

In this embodiment of the present disclosure, in a process of QAM signal modulation that is based on probability shaping, the network device combines DM encoding with easy-to-implement phase modulation to replace a manner of directly performing DM encoding. In this way, when same bit data is modulated, in comparison with a direct DM encoding process, a DM encoding process based on a combination of DM encoding and phase modulation has a smaller mapping depth and much lower complexity. Therefore, a QAM signal modulation method based on probability shaping is less complex, and efficient and applicable.

Embodiment 2

Figure 3:
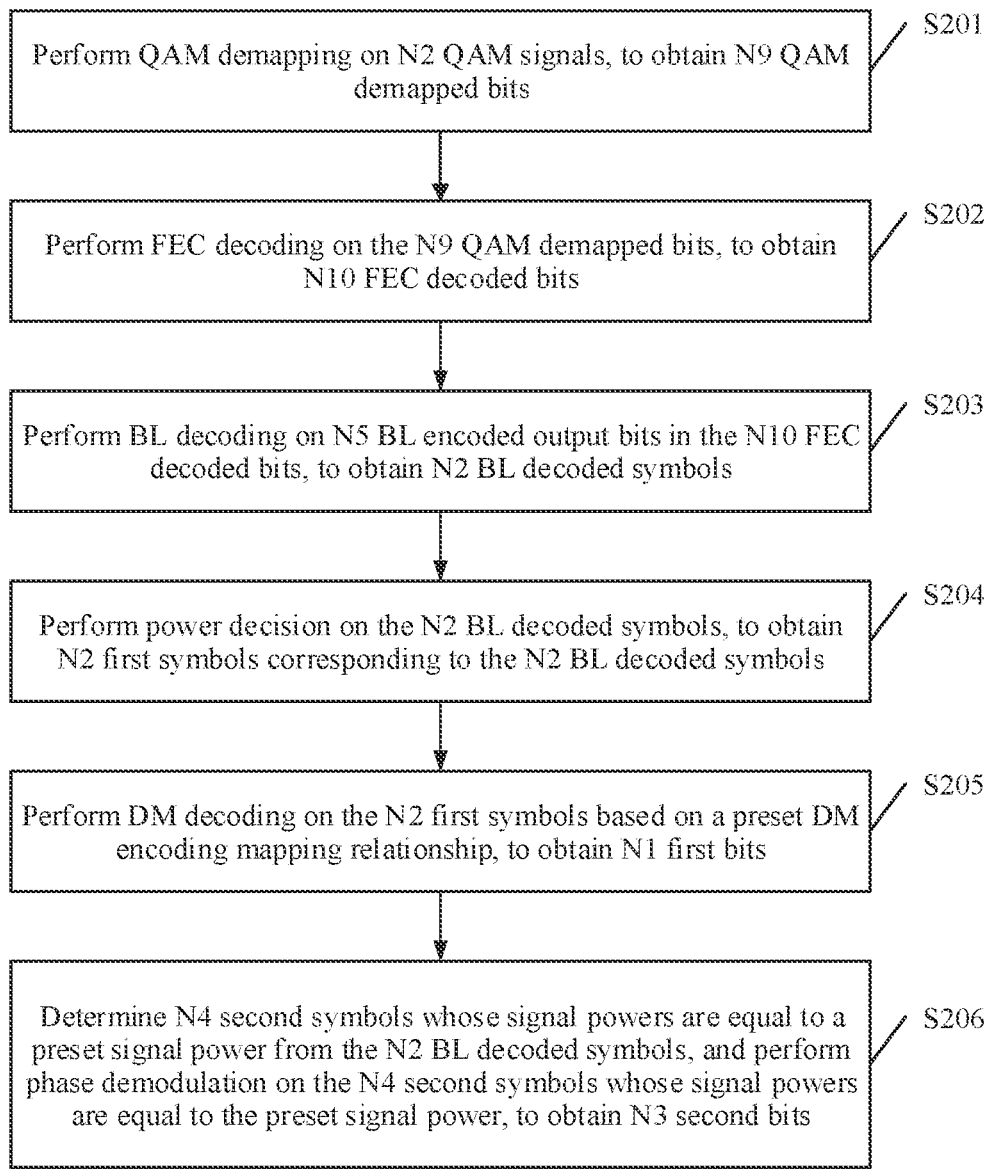
FIG. 3 is a schematic flowchart of a QAM signal demodulation method according to an embodiment of the present disclosure.

FIG. 3 shows a QAM signal demodulation method according to an embodiment of the present disclosure. The QAM signal demodulation method corresponds to the QAM signal modulation method described in Embodiment 1, and is used to demodulate one or more QAM signals obtained through modulation based on the QAM signal demodulation method, to obtain a plurality of first bits or second bits. The method may be performed by a network device having a QAM signal demodulation function, such as an optical transceiver. For ease of understanding and description, the network device is used as an execution body in this embodiment for description. The QAM signal demodulation method includes the following steps.

S201: Perform QAM demapping on N2 QAM signals, to obtain N9 QAM demapped bits.

In some feasible implementations, after obtaining the N2 QAM signals, the network device performs demapping on the N2 QAM signals, to obtain the N9 QAM demapped bits. Herein, the N9 QAM demapped bits include at least N6 FEC redundant bits.

In specific implementation, the network device may demodulate the N2 QAM signals through quadrature coherent demodulation, to obtain an in-phase component and a quadrature component corresponding to each of the N2 QAM signals. Then, the network device performs low-pass filtering on the in-phase component and the quadrature component corresponding to each QAM signal, to obtain envelope waveforms corresponding to the components. Then, the network device may perform sampling and decision on the envelope waveforms of the in-phase component and the quadrature component corresponding to each QAM signal, to obtain a binary rectangular waveform corresponding to the QAM signal. Finally, the network device converts the binary waveform corresponding to the QAM signal, to obtain the N9 demapped bits corresponding to the N2 QAM signals. It should be noted that the N9 demapped bits include at least N6 redundant bits, and the network device may perform error detection based on the N6 redundant bits, to ensure validity of the QAM signal obtained by the network device.

S202: Perform FEC decoding on the N9 QAM demapped bits, to obtain N10 FEC decoded bits.

In some feasible implementations, after obtaining the N9 QAM demapped bits, the network device may perform FEC decoding on the N9 QAM demapped bits, to obtain the N10 FEC decoded bits corresponding to the N9 QAM demapped bits. Herein, the N10 FEC decoded bits include at least N5 BL encoded output bits. Optionally, if N7 quadrant selection bits are used in a modulation process of the N2 QAM signals, the N10 FEC decoded bits further include the N7 quadrant selection bits.

S203. Perform BL decoding on the N5 BL encoded output bits in the N10 FEC decoded bits, to obtain N2 BL decoded symbols.

In some feasible implementations, after obtaining the N5 BL encoded output bits, the network device may determine, based on a preset mapping relationship between a symbol and a BL encoded output bit, the N2 BL decoded symbols corresponding to the N5 BL encoded output bits. Herein, the preset mapping relationship between a symbol and a BL encoded output bit is a mapping relationship corresponding to the BL encoding process described in Embodiment 1.

S204: Perform power decision on the N2 BL decoded symbols, to obtain N2 first symbols corresponding to the N2 BL decoded symbols.

In some feasible implementations, after obtaining the N2 BL decoded symbols, the network device may perform power decision on the N2 BL decoded symbols, to obtain the N2 first symbols corresponding to the N2 BL decoded symbols. In specific implementation, the following describes a process of performing power decision on the N2 BL decoded symbols by using, as an example, a process of performing power decision on any BL decoded symbol x in the N2 BL decoded symbols by the network device. The network device may first calculate an actual signal power corresponding to the BL decoded symbol x. Then, the network device may determine whether the actual signal power of the BL decoded symbol x falls within a decision range corresponding to a preset first power. The decision range corresponding to the first power is determined based on the first power and a preset error value. For example, assuming that the first power is represented by a, and the preset error value is represented by ±b, the decision range corresponding to the first power is [a−b, a+b]. If determining that the actual signal power of the BL decoded symbol x falls within the decision range corresponding to the first power, the network device may determine that the signal power corresponding to the BL decoded symbol x is equal to the first power, in other words, the signal power corresponding to the BL decoded symbol x is a. If determining that the actual signal power of the BL decoded symbol x does not fall within the decision range corresponding to the first power, the network device may continue to determine whether the actual signal power of the BL decoded symbol x falls within a decision range corresponding to another power. For a specific process, refer to the foregoing description, and details are not described herein again. By repeating the foregoing operation, the network device may complete power decision on the N2 BL decoded symbols, to obtain the N2 first symbols corresponding to the N2 BL decoded symbols.

S205: Perform DM decoding on the N2 first symbols based on a preset DM decoding mapping relationship, to obtain N1 first bits.

In some feasible implementations, after obtaining the N2 first symbols, the network device may perform DM decoding on the N2 first symbols based on the preset DM encoding mapping relationship, to obtain the N1 first bits. Herein, the preset DM encoding mapping relationship is a mapping relationship corresponding to the DM encoding process described in Embodiment 1.

S206: Determine N4 second symbols whose signal powers are equal to a preset signal power from the N2 BL decoded symbols, and perform phase demodulation on the N4 second symbols whose signal powers are equal to the preset signal power, to obtain N3 second bits.

In some feasible implementations, after obtaining the N2 BL decoded symbols, the network device may determine the N4 second symbols whose signal powers are equal to the preset signal power from the N2 BL decoded symbols, and perform phase demodulation on the N4 second symbols whose signal powers are equal to the preset signal power, to obtain the N3 second bits.

In specific implementation, the network device may determine a signal power corresponding to each of the N2 BL decoded symbols. Then, the network device may obtain the preset signal power; compare the signal power corresponding to each decoded symbol with the preset signal power, to select N4 BL decoded symbols whose signal powers are equal to the preset signal power, and determine the N4 BL decoded symbols as the N4 second symbols. Herein, the preset signal power may include a plurality of signal powers. The following uses a phase demodulation process of any second symbol p in the N4 second symbols as an example to describe a process in which the network device performs phase demodulation on the N4 second symbols to obtain the N3 second bits. The network device may perform phase demodulation on the second symbol p, to obtain a target phase modulation bit corresponding to the second symbol p. Herein, the target phase modulation bit is used to determine a phase corresponding to the second symbol p from a preset target phase set, a bit quantity of the target phase modulation bit is not less than 1, and second symbols having different signal powers correspond to different bit quantities of target phase modulation bits. Specifically, the network device may determine a target phase corresponding to the second symbol p and determine, based on the correspondence that is between a target phase modulation bit and a target phase and that is determined in the phase modulation process described in Embodiment 1, the target phase modulation bit corresponding to the second symbol p. Likewise, the network device may perform the foregoing phase demodulation operations each of the N4 second symbols whose signal powers are equal to the preset signal power, to obtain N4 target phase modulation bits. Because the target phase modulation bit is formed by one or more second bits, the network device may directly determine the N4 target phase modulation bits as the N3 second bits.

Optionally, after obtaining the N3 second bits, the network device may further perform phase bit decoding on the N3 second bits based on a mapping relationship corresponding to the phase bit encoding process described in Embodiment 1, to obtain N31 phase modulation bits on which phase bit encoding needs to be performed.

Optionally, the network device may first receive the N2 QAM signals before performing QAM demapping on the N2 QAM signals. For example, in a specific implementation scenario of optical signal transmission, the network device may first receive a series of optical signals over a preset channel, and then perform optical-to-electrical conversion on the series of optical signals, to obtain N2 QAM signals corresponding to the series of optical signals.

In this embodiment of the present disclosure, the QAM signal demodulation method corresponding to the QAM signal modulation method described in Embodiment 1 is provided. The network device combines DM decoding and easy-to-implement phase demodulation to accurately and effectively demodulate the QAM signal obtained through modulation based on the QAM signal modulation method. Therefore, the QAM signal modulation method and the QAM signal demodulation method that are based on probability shaping are less complex, and highly efficient and applicable.

Embodiment 3

Figure 4:
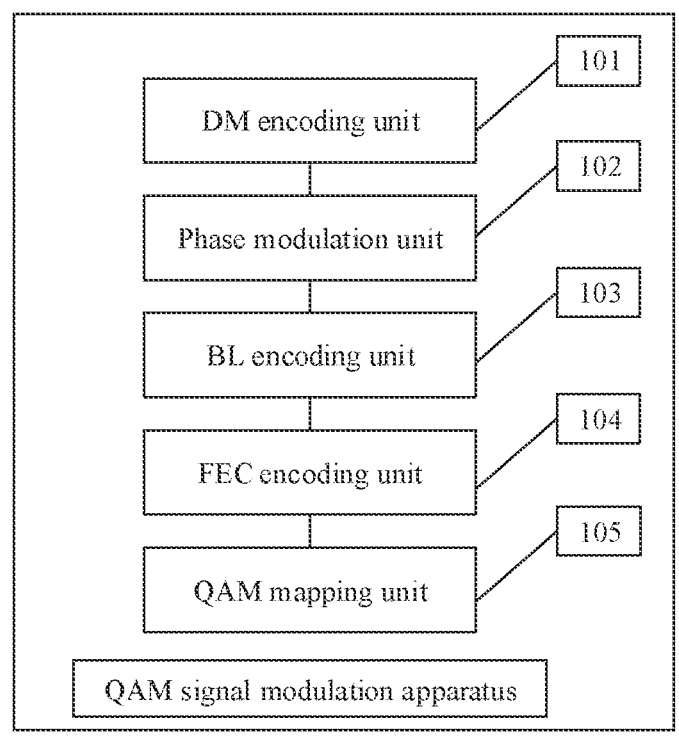
FIG. 4 is a schematic diagram of a structure of a QAM signal modulation apparatus according to an embodiment of the present disclosure.

FIG. 4 is a schematic diagram of a structure of a QAM signal modulation apparatus according to an embodiment of the present disclosure. The QAM signal modulation apparatus includes a DM encoding unit 101, a phase modulation unit 102, a BL encoding unit 103, an FEC encoding unit 104, and a QAM mapping unit 105.

The DM encoding unit 101 is configured to perform distribution matching DM encoding on N1 first bits, to obtain N2 first symbols. Signal powers corresponding to the N2 first symbols includes at least a first power and a second power.

The phase modulation unit 102 is configured to: determine, from the N2 first symbols obtained by the DM encoding unit 101, N4 to-be-phase-modulated symbols whose signal powers are equal to a preset signal power, and perform phase modulation on the N4 to-be-phase-modulated symbols based on N3 second bits, to obtain N4 second symbols. Herein, some or all of signal powers corresponding to the N2 first symbols are equal to the preset signal power.

The BL encoding unit 103 is configured to perform binary labeling BL encoding on the N4 second symbols and N2-N4 first symbols in the N2 first symbols except the N4 to-be-phase-modulated symbols, to obtain N5 BL encoded output bits, where the N4 second symbols are obtained by the phase modulation unit 102, and the N2 first symbols are obtained by the DM encoding unit.

The FEC encoding unit 104 is configured to perform forward error correction FEC encoding on the N5 BL encoded output bits obtained by the BL encoding unit 103, to obtain N6 FEC redundant bits.

The QAM mapping unit 105 is configured to perform quadrature amplitude modulation QAM mapping based on the N6 FEC redundant bits obtained by the FEC encoding unit 104 and the N5 BL encoded output bits obtained by the BL encoding unit 103, to obtain N2 target QAM signals.

In some feasible implementations, the phase modulation unit 102 is configured to:

perform the following phase modulation operations on any to-be-phase-modulated symbol i in the N4 to-be-phase-modulated symbols: obtaining a bit quantity Ti of a target phase modulation bit corresponding to the to-be-phase-modulated symbol i; determining, from the N3 second bits based on the bit quantity Ti and a target location of the to-be-phase-modulated symbol i in the N4 to-be-phase-modulated symbols, the target phase modulation bits j corresponding to the to-be-phase-modulated symbol i, where the target phase modulation bits j includes Ti second bits; determining, based on the target phase modulation bit j, a target phase s corresponding to the to-be-phase-modulated symbol i from a target phase set corresponding to the to-be-phase-modulated symbol i; performing phase modulation on the to-be-phase-modulated symbol i based on the target phase s, to obtain a second symbol corresponding to the to-be-phase-modulated symbol i; and determining, based on a second symbol obtained by performing the phase modulation operations on each of the N4 to-be-phase-modulated symbols, the N4 second symbols corresponding to the N4 to-be-phase-modulated symbols.

Figure 5:
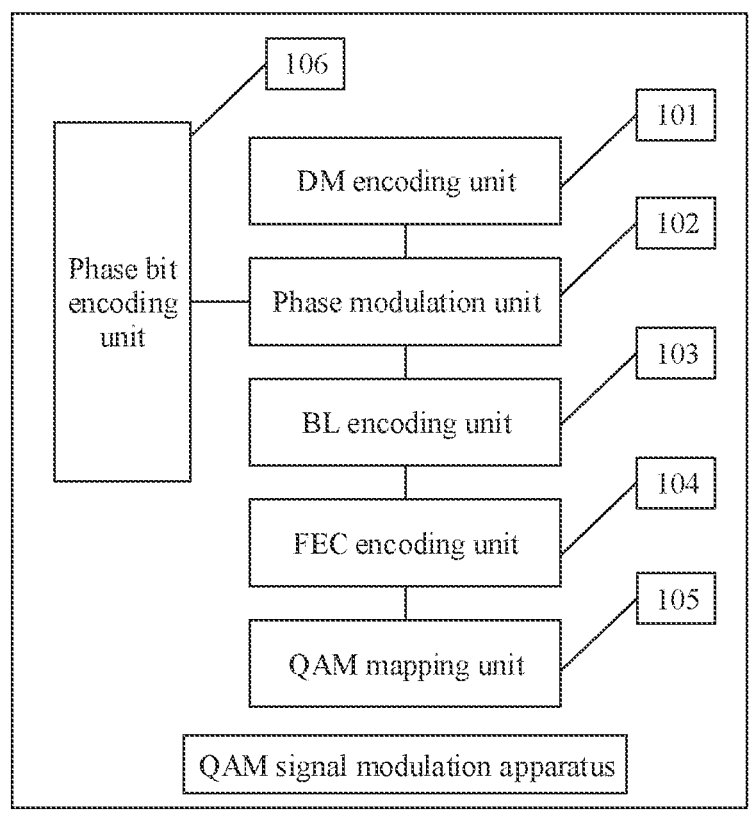
FIG. 5 is a schematic diagram of another structure of a QAM signal modulation apparatus according to an embodiment of the present disclosure.

In some feasible implementations. FIG. 5 is a schematic diagram of another structure of a QAM signal modulation apparatus according to an embodiment of the present disclosure. It can be learned from FIG. 5 that the QAM signal modulation apparatus further includes a phase bit encoding unit 106.

The phase bit encoding unit 106 is configured to: obtain N31 phase modulation bits and perform phase bit encoding on the N31 phase modulation bits, to obtain the N3 second bits. The N3 second bits include N4 target phase modulation bits.

Figure 6:
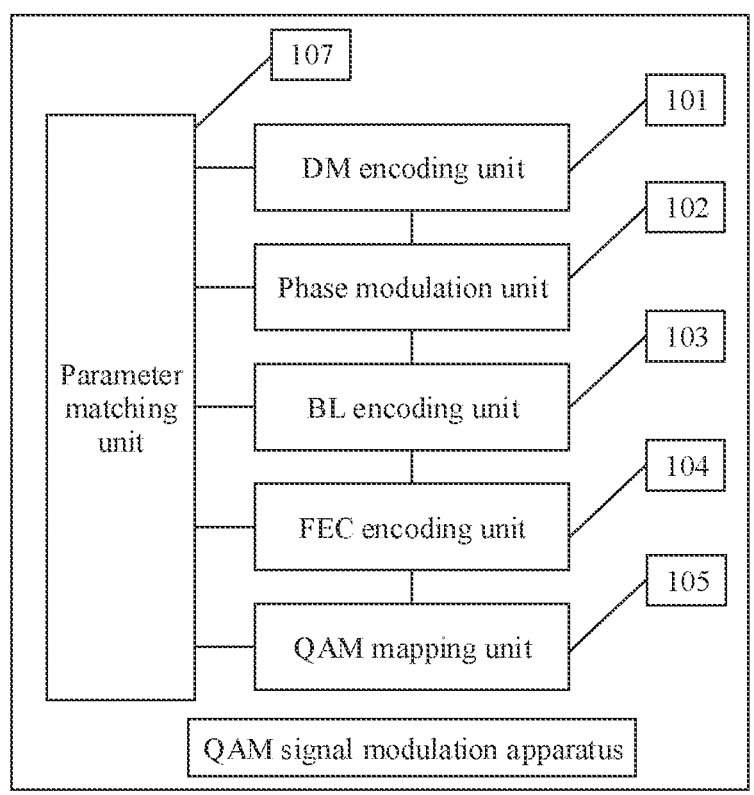
FIG. 6 is a schematic diagram of still another structure of a QAM signal modulation apparatus according to an embodiment of the present disclosure.

In some feasible implementations, FIG. 6 is a schematic diagram of still another structure of a QAM signal modulation apparatus according to an embodiment of the present disclosure. It can be learned from FIG. 6 that the QAM signal modulation apparatus further includes a parameter matching unit 107.

The parameter matching unit 107 is configured to determine, based on the preset signal power, a quantity N3 of second bits used for phase modulation.

In some feasible implementations, the parameter matching unit 107 is configured to:

determine, based on the preset signal power and signal powers corresponding to symbols output by the DM encoding unit 101, a quantity N4 of to-be-phase-modulated symbols; determine a bit quantity of a target phase modulation bit corresponding to each of the N4 to-be-phase-modulated symbols, where the target phase modulation bit is used to determine a target phase corresponding to the to-be-phase-modulated symbol from a preset target phase set, and to-be-phase-modulated symbols having different signal powers correspond to different target phase sets; and determine the quantity N3 of the second bits used for phase modulation, based on the quantity N4 of to-be-phase-modulated symbols and the bit quantity of the target phase modulation bit corresponding to each of the N4 to-be-phase-modulated symbols.

In some feasible implementations, the parameter matching unit 107 is configured to:

perform, on the any to-be-phase-modulated symbol i in the N4 to-be-phase-modulated symbols, the following operations for determining the bit quantity of the target phase modulation bit:

determining a quantity D of types of phases in the target phase set corresponding to the to-be-phase-modulated symbol i; and determining, based on the quantity D of types of phases, the bit quantity of the target phase modulation bit corresponding to the to-be-phase-modulated symbol i, where the target phase modulation bit includes one or more second bits that are in the N3 second bits and that are used to determine a target phase corresponding to a specific to-be-phase-modulated symbol, and the bit quantity of the target phase modulation bit is equal to a value obtained by rounding up $\log_2(D)$; and obtain, by performing, on each of the N4 to-be-phase-modulated symbols, the operations for determining the bit quantity of the target phase modulation bit, the bit quantity of the target phase modulation bit corresponding to the to-be-phase-modulated symbol.

In some feasible implementations, the FEC encoding unit 104 is configured to:

perform forward error correction FEC encoding based on the N5 BL encoded output bits obtained by the BL encoding unit 103 and N7 quadrant selection bits, to obtain the N6 FEC redundant bits.

In some feasible implementations, the QAM mapping unit 105 is configured to:

determine N8 target quadrant selection bits based on the N6 FEC redundant bits obtained by the FEC encoding unit 104 and the N7 quadrant selection bits, where N8=N6+N7; and perform, based on the N8 target quadrant selection bits, quadrature amplitude modulation QAM mapping on the N5 BL encoded output bits obtained by the BL encoding unit 103, to obtain the N2 target QAM signals.

Figure 7:
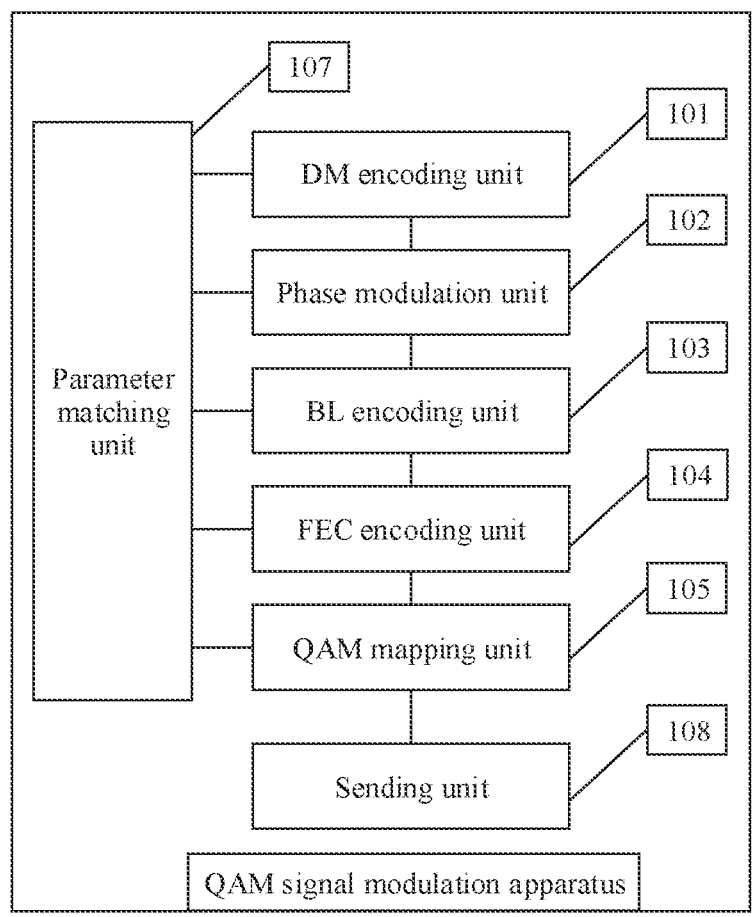
FIG. 7 is a schematic diagram of still another structure of a QAM signal modulation apparatus according to an embodiment of the present disclosure.

In some feasible implementations, FIG. 7 is a schematic diagram of still another structure of a QAM signal modulation apparatus according to an embodiment of the present disclosure. It can be learned from FIG. 7 that the QAM signal modulation apparatus further includes a sending unit 108.

The sending unit 108 is configured to send the N2 target QAM signals determined by the QAM mapping unit 105.

In some feasible implementations, after obtaining the N1 first bits, the DM encoding unit 101 may perform DM encoding on the N1 first bits, to encode the N1 first bits into the N2 first symbols. For a specific DM encoding process, refer to the DM encoding process described in step S101 in Embodiment 1. Details are not described herein again. Then, the phase modulation unit 102 may determine, from the N2 first symbols, the N4 to-be-phase-modulated symbols whose signal powers are equal to the preset signal power, and perform phase modulation on the N4 to-be-phase-modulated symbols based on the N3 second bits, to obtain the N4 second symbols. For a specific process, refer to the process of determining the N4 second symbols based on the N2 first symbols that is described in step S102 in Embodiment 1. Details are not described herein again. Optionally, the phase modulation unit 102 may determine the preset signal power based on a preset target constellation diagram. Optionally, the parameter matching unit 107 is configured to determine, based on the preset signal power, the quantity N3 of the second bits used for phase modulation. For a specific process, refer to the process, described in step S102 in Embodiment 1, of determining the quantity N3 of the second bits. Details are not described herein again. Then, the BL encoding unit 103 may perform binary labeling BL encoding on the N4 second symbols and the N2-N4 first symbols in the N2 first symbols except the N4 to-be-phase-modulated symbols, to obtain the N5 BL encoded output bits. For a specific process, refer to the BL encoding process described in step S103 in Embodiment 1. Details are not described herein again. Next, the FEC encoding unit 104 may perform forward error correction FEC encoding on the N5 BL encoded output bits, to obtain the N6 FEC redundant bits. For a specific process, refer to the FEC encoding process described in step S104 in Embodiment 1. Details are not described herein again. Optionally, the FEC encoding unit 104 may further perform FEC encoding on the N5 BL encoded output bits and the N7 quadrant selection bits, to obtain the N6 FEC redundant bits. Finally, the QAM mapping unit 105 may perform QAM mapping based on the N6 FEC redundant bits and the N5 BL encoded output bits, to obtain the N2 target QAM signals. Optionally, after the QAM mapping unit 105 determines the N2 target QAM signals, the sending unit 108 may further send the N2 target QAM signals.

In this embodiment of the present disclosure, in a process of QAM signal modulation based on probability shaping, DM encoding is combined with easy-to-implement phase modulation to replace a manner of directly performing DM encoding. When same bit data is modulated, in comparison with a direct DM encoding process, a DM encoding process based on a combination of DM encoding and phase modulation enables a smaller mapping depth and much lower complexity. Therefore, a QAM signal modulation method based on probability shaping is less complex, and highly efficient and applicable.

Embodiment 4

Figure 8:
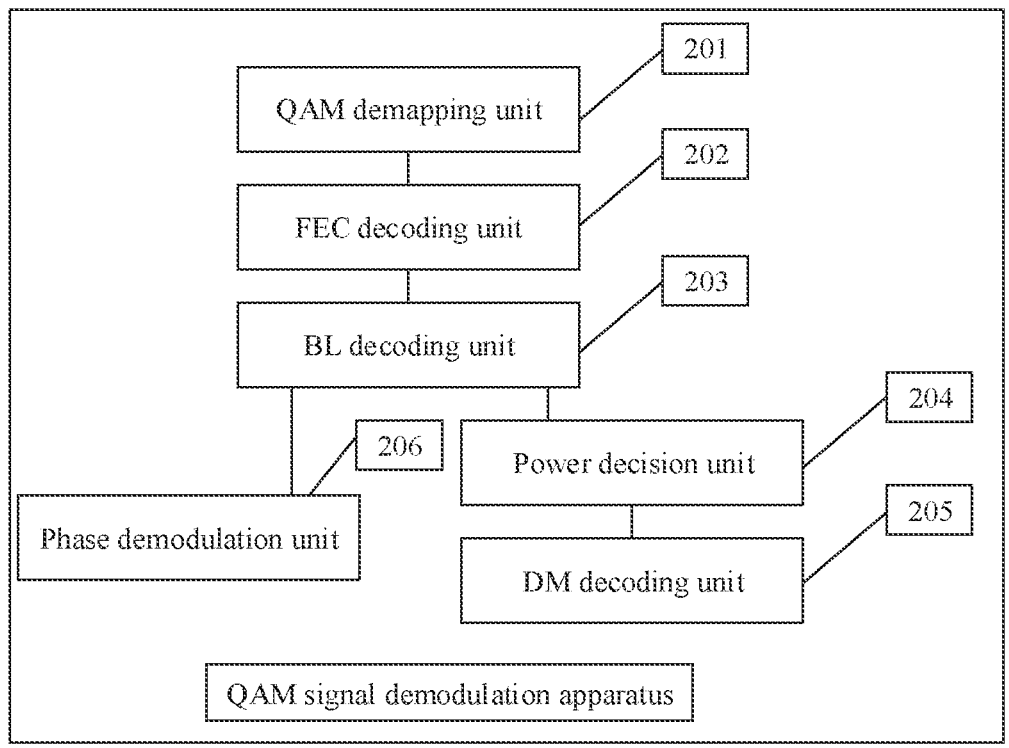
FIG. 8 is a schematic diagram of a structure of a QAM signal demodulation apparatus according to an embodiment of the present disclosure.

FIG. 8 is a schematic diagram of a structure of a QAM signal demodulation apparatus according to an embodiment of the present disclosure. It can be learned from FIG. 8 that the QAM signal demodulation apparatus includes a QAM demapping unit 201, an FEC decoding unit 202, a BL decoding unit 203, a power decision unit 204, a DM decoding unit 205, and a phase demodulation unit 206.

The QAM demapping unit 201 is configured to perform QAM demapping on N2 QAM signals, to obtain N9 QAM demapped bits. Herein, the N9 QAM demapped bits include at least N6 FEC redundant bits.

The FEC decoding unit 202 is configured to perform FEC decoding on the N9 QAM demapped bits obtained by the QAM demapping unit 201, to obtain N10 FEC decoded bits, where the N10 FEC decoded bits include at least N5 BL encoded output bits.

The BL decoding unit 203 is configured to perform BL decoding on the N5 BL encoded output bits obtained by the FEC decoding unit 202, to obtain N2 BL decoded symbols.

The power decision unit 204 is configured to perform power decision on the N2 BL decoded symbols obtained by the BL decoding unit 203, to obtain N2 first symbols corresponding to the N2 BL decoded symbols. Herein, one BL decoded symbol corresponds to one first symbol.

The DM decoding unit 205 is configured to perform, based on a preset DM encoding mapping relationship, DM decoding on the N2 first symbols obtained by the power decision unit 204, to obtain N1 first bits.

The phase demodulation unit 206 is configured to: determine N4 second symbols whose signal powers are equal to a preset signal power from the N2 BL decoded symbols obtained by the BL decoding unit, and perform phase demodulation on the N4 second symbols whose signal powers are equal to the preset signal power, to obtain N3 second bits.

Herein, signal powers corresponding to the N2 first symbols include at least a first power and a second power, and some or all of signal powers corresponding to the N2 first symbols are equal to the preset signal power.

In some feasible implementations, the phase demodulation unit 206 is configured to:

perform the following phase demodulation operation on any second symbol p in the N4 second symbols whose signal powers are equal to the preset signal power: performing phase demodulation on the second symbol p to obtain a target phase modulation bit corresponding to the second symbol p, where the target phase modulation bit is used to determine a phase corresponding to the second symbol p from a preset target phase set, a bit quantity of the target phase modulation bit is not less than 1, and second symbols having different signal powers correspond to different bit quantities of target phase modulation bits; and determining, as the N3 second bits, N4 target phase modulation bits obtained by performing the phase demodulation operation on each of the N4 second symbols whose signal powers are equal to the preset signal power. One target phase modulation bit includes at least one second bit.

Figure 9:
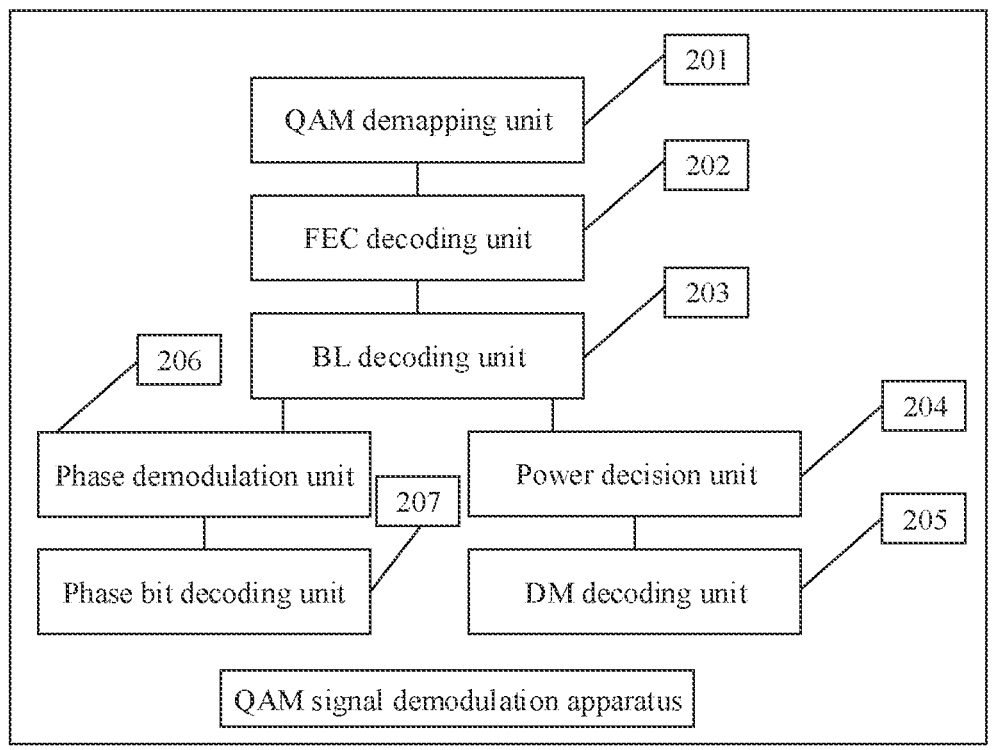
FIG. 9 is a schematic diagram of another structure of a QAM signal demodulation apparatus according to an embodiment of the present disclosure.

In some feasible implementations, FIG. 9 is a schematic diagram of another structure of a QAM signal demodulation apparatus according to an embodiment of the present disclosure. It can be learned from FIG. 9 that the QAM signal demodulation apparatus further includes a phase bit decoding unit 207.

The phase bit decoding unit 207 is configured to perform phase bit decoding on the N3 second bits obtained by the phase demodulation unit 206, to obtain N31 phase modulation bits.

In some feasible implementations, the N10 FEC decoded bits further include N7 quadrant selection bits.

Figure 10:
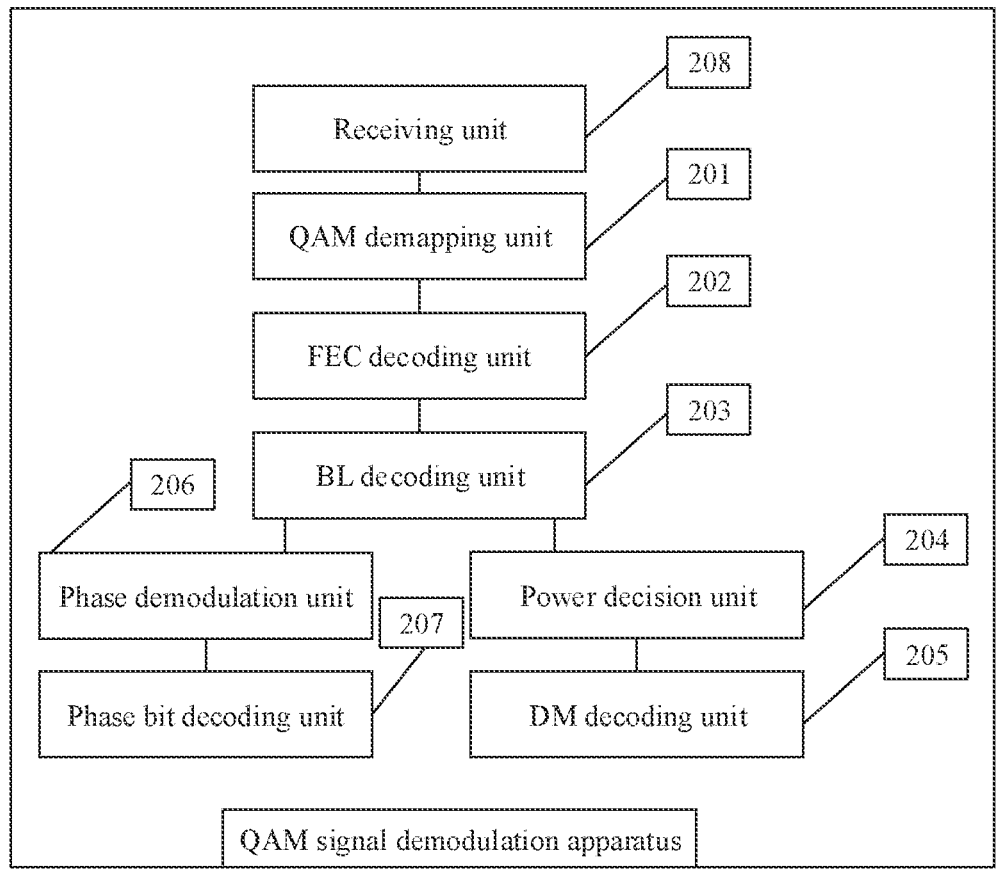
FIG. 10 is a schematic diagram of still another structure of a QAM signal demodulation apparatus according to an embodiment of the present disclosure.

In some feasible implementations, FIG. 10 is a schematic diagram of still another structure of a QAM signal demodulation apparatus according to an embodiment of the present disclosure. It can be learned from FIG. 10 that the QAM signal demodulation apparatus further includes a receiving unit 208. The receiving unit 208 is configured to receive the N2 target QAM signals.

In some feasible implementations, the QAM signal demodulation apparatus is configured to perform any possible implementation of the QAM signal demodulation method in Embodiment 2. Therefore, the QAM signal demodulation apparatus can also achieve beneficial effects of the QAM signal demodulation method.

In this embodiment of the present disclosure, the QAM signal demodulation apparatus corresponding to the QAM signal modulation apparatus described in Embodiment 3 is provided. The apparatus combines DM decoding and easy-to-implement phase demodulation to accurately and effectively demodulate the QAM signal obtained through modulation based on the QAM signal modulation apparatus. Therefore, the QAM signal modulation method and the QAM signal demodulation method that are based on probability shaping are less complex, and highly efficient and applicable.

Figure 11:
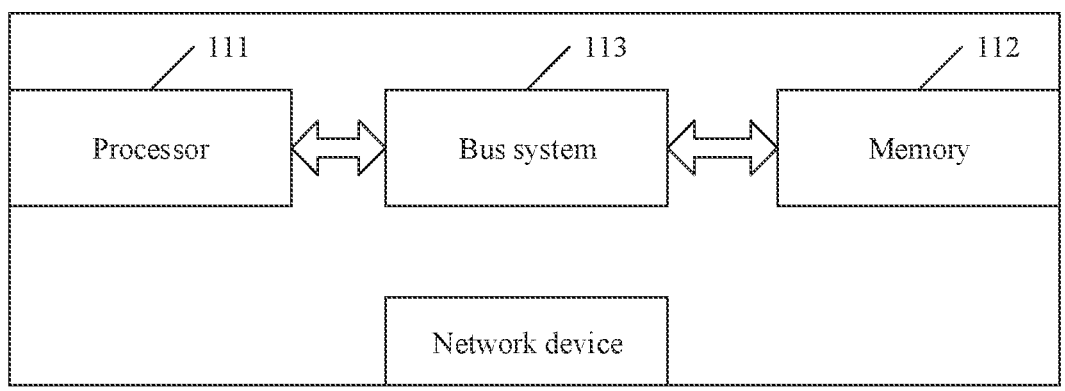
FIG. 11 is a schematic diagram of a structure of a network device according to an embodiment of the present disclosure.

FIG. 11 is a schematic diagram of a structure of a network device according to an embodiment of the present disclosure. The network device provided in this embodiment of the present disclosure includes a processor 111, a memory 112, and a bus system 113. The processor 111 and the memory 112 are connected by the bus system 113.

The memory 112 is configured to store a program. Specifically, the program may include program code, and the program code includes a computer operation instruction. The memory 112 includes but is not limited to a random access memory (RAM), a read-only memory (ROM), an erasable programmable read-only memory (EPROM), or a compact disc read-only memory (CD-ROM). Only one memory is shown in FIG. 11. Certainly, a plurality of memories may be disposed as required.

The memory 112 may alternatively be a memory in the processor 111. This is not limited herein.

The memory 112 stores the following elements: an executable module or a data structure, a subset thereof, or an extended set thereof:

an operation instruction, including various operation instructions and used to implement various operations; and an operating system, including various system programs and used to implement various basic services and process a hardware-based task.

The processor 111 controls an operation of the network device, and the processor 111 may include one or more central processing units (CPU). When the processor 111 includes one CPU, the CPU may be a single-core CPU, or may be a multi-core CPU.

During specific application, components of the network device are coupled together through the bus system 113. In addition to a data bus, the bus system 113 further includes a power bus, a control bus, and a status signal bus. However, for clear description, various types of buses in FIG. 11 are marked as the bus system 113. For ease of illustration, the bus system 113 is merely schematically drawn in FIG. 11.

The QAM signal modulation method and/or the QAM signal demodulation method disclosed in some embodiments of the present disclosure may be applied to the processor 111, or may be implemented by the processor 111. The processor 111 may be an integrated circuit chip and has a signal processing capability.

An embodiment of the present disclosure provides a computer-readable storage medium. The computer-readable storage medium stores an instruction, and when the instruction is run on a computer, the QAM signal modulation method described in Embodiment 1 or the QAM signal demodulation method described in Embodiment 2 may be performed.

The computer-readable storage medium may be the QAM signal modulation apparatus described in Embodiment 1, or an internal storage unit of the QAM signal demodulation apparatus described in Embodiment 2. The computer-readable storage medium may alternatively be an external storage device of the network device, for example, a removable hard disk, a smart media card (SMC), a secure digital (SD) card, a flash card, or the like that is provided on the network device. Further, the computer-readable storage medium may alternatively include both an internal storage unit and an external storage device of the foregoing network device. The computer-readable storage medium is configured to store the computer program and other programs and data that are required by the network device. The computer-readable storage medium may be further configured to temporarily store data that has been output or is to be output.

A person of ordinary skill in the art may understand that all or some of the processes of the methods in the embodiments may be implemented by a computer program instructing relevant hardware. The program may be stored in a computer-readable storage medium. When the program runs, the processes of the methods in the embodiments are performed. The foregoing storage medium includes any medium that can store program code, such as a ROM, a random access memory RAM, a magnetic disk, or an optical disc.

What is claimed is:

1. A quadrature amplitude modulation (QAM) signal modulation method, wherein the method comprises:
performing distribution matching (DM) encoding on N1 first bits to obtain N2 first symbols, wherein signal powers corresponding to the N2 first symbols comprise at least a first power and a second power;
determining N4 to-be-phase-modulated symbols whose signal powers are equal to a preset signal power from the N2 first symbols, and performing phase modulation on the N4 to-be-phase-modulated symbols based on N3 second bits to obtain N4 second symbols, wherein some or all of signal powers corresponding to the N2 first symbols are equal to the preset signal power;
performing binary labeling (BL) encoding on the N4 second symbols and N2-N4 first symbols in the N2 first symbols except the N4 to-be-phase-modulated symbols to obtain N5 BL encoded output bits;
performing forward error correction (FEC) encoding on the N5 BL encoded output bits to obtain N6 FEC redundant bits; and
performing QAM mapping based on the N6 FEC redundant bits and the N5 BL encoded output bits to obtain N2 target QAM signals.

2. The method according to claim 1, wherein the performing phase modulation on the N4 to-be-phase-modulated symbols based on N3 second bits to obtain N4 second symbols comprises:
performing the following phase modulation operations on any to-be-phase-modulated symbol i in the N4 to-be-phase-modulated symbols:
obtaining a bit quantity $T_i$ of a target phase modulation bit corresponding to the to-be-phase-modulated symbol i;
determining, from the N3 second bits based on the bit quantity $T_i$ and a target location of the to-be-phase-modulated symbol i in the N4 to-be-phase-modulated symbols, the target phase modulation bit j corresponding to the to-be-phase-modulated symbol i, wherein the target phase modulation bit j comprises $T_i$ second bits;
determining, based on the target phase modulation bit j, a target phase s corresponding to the to-be-phase-modulated symbol i from a target phase set corresponding to the to-be-phase-modulated symbol i; and
performing phase modulation on the to-be-phase-modulated symbol i based on the target phase s to obtain a second symbol corresponding to the to-be-phase-modulated symbol i; and
determining the N4 second symbols corresponding to the N4 to-be-phase-modulated symbols by performing the phase modulation operations on each of the N4 to-be-phase-modulated symbols.

3. The method according to claim 1, wherein before the performing phase modulation on the N4 to-be-phase-modulated symbols based on N3 second bits, the method further comprises:
obtaining N31 phase modulation bits and performing phase bit encoding on the N31 phase modulation bits to obtain the N3 second bits, wherein the N3 second bits comprise N4 target phase modulation bits.

4. The method according to claim 1, wherein before the performing distribution matching (DM) encoding on N1 first bits, the method further comprises:
determining, based on the preset signal power, a quantity N3 of second bits used for phase modulation.

5. The method according to claim 4, wherein the determining, based on the preset signal power, a quantity N3 of second bits used for phase modulation comprises:
determining, based on the preset signal power and signal powers corresponding to symbols output through DM encoding, a quantity N4 of to-be-phase-modulated symbols;
determining a bit quantity of a target phase modulation bit corresponding to each of the N4 to-be-phase-modulated symbols, wherein the target phase modulation bit is used to determine a target phase corresponding to the to-be-phase-modulated symbol from a preset target phase set, and wherein to-be-phase-modulated symbols having different signal powers correspond to different target phase sets; and
determining the quantity N3 of the second bits used for phase modulation based on the quantity N4 of the to-be-phase-modulated symbols and the bit quantity of the target phase modulation bit corresponding to each of the N4 to-be-phase-modulated symbols.

6. The method according to claim 5, wherein the determining a bit quantity of a target phase modulation bit corresponding to each of the N4 to-be-phase-modulated symbols comprises:
performing, on any to-be-phase-modulated symbol i in the N4 to-be-phase-modulated symbols, the following operations for determining the bit quantity of the target phase modulation bit;
determining a quantity D of types of phases in the target phase set corresponding to the to-be-phase-modulated symbol i; and
determining, based on the quantity D of types of phases, the bit quantity of the target phase modulation bit corresponding to the to-be-phase-modulated symbol i, wherein the target phase modulation bit comprises one or more second bits that are in the N3 second bits and that are used to determine a target phase corresponding to a specific to-be-phase-modulated symbol, and wherein the bit quantity of the target phase modulation bit is equal to a value obtained by rounding up $\log_2(D)$; and
obtaining, by performing, on each of the N4 to-be-phase-modulated symbols, the operations for determining the bit quantity of the target phase modulation bit, the bit quantity of the target phase modulation bit corresponding to the to-be-phase-modulated symbol.

7. The method according to claim 6, wherein the performing forward error correction (FEC) encoding on the N5 BL encoded output bits to obtain N6 FEC redundant bits comprises:
performing FEC encoding based on N7 quadrant selection bits and the N5 BL encoded output bits to obtain the N6 FEC redundant bits.

8. The method according to claim 7, wherein the performing QAM mapping based on the N6 FEC redundant bits and the N5 BL encoded output bits to obtain N2 target QAM signals comprises:
determining N8 target quadrant selection bits based on the N6 FEC redundant bits and the N7 quadrant selection bits, wherein N8=N6+N7; and performing QAM mapping on the N5 BL encoded output bits based on the N8 target quadrant selection bits to obtain the N2 target QAM signals.

9. A quadrature amplitude modulation (QAM) signal modulation device, comprising:
one or more processors; and
a non-transitory computer-readable storage medium storing program instructions which, when executed by the one or more processors, cause the device to:
perform distribution matching (DM) encoding on N1 first bits to obtain N2 first symbols, wherein signal powers corresponding to the N2 first symbols comprise at least a first power and a second power;
determine N4 to-be-phase-modulated symbols whose signal powers are equal to a preset signal power from the N2 first symbols, and performing phase modulation on the N4 to-be-phase-modulated symbols based on N3 second bits to obtain N4 second symbols, wherein some or all of signal powers corresponding to the N2 first symbols are equal to the preset signal power;
perform binary labeling (BL) encoding on the N4 second symbols and N2-N4 first symbols in the N2 first symbols except the N4 to-be-phase-modulated symbols to obtain N5 BL encoded output bits;
perform forward error correction (FEC) encoding on the N5 BL encoded output bits to obtain N6 FEC redundant bits; and
perform QAM mapping based on the N6 FEC redundant bits and the N5 BL encoded output bits to obtain N2 target QAM signals.

10. The device according to claim 9, wherein when executed by the one or more processors, the program instructions further cause the device to:
perform the following phase modulation operations on any to-be-phase-modulated symbol i in the N4 to-be-phase-modulated symbols:
obtaining a bit quantity $T_i$ of a target phase modulation bit corresponding to the to-be-phase-modulated symbol i;
determining, from the N3 second bits based on the bit quantity $T_i$ and a target location of the to-be-phase-modulated symbol i in the N4 to-be-phase-modulated symbols, the target phase modulation bit j corresponding to the to-be-phase-modulated symbol i, wherein the target phase modulation bit j comprises $T_i$ second bits;
determining, based on the target phase modulation bit j, a target phase s corresponding to the to-be-phase-modulated symbol i from a target phase set corresponding to the to-be-phase-modulated symbol i; and
performing phase modulation on the to-be-phase-modulated symbol i based on the target phase s to obtain a second symbol corresponding to the to-be-phase-modulated symbol i; and
determine, based on a second symbol obtained by performing the phase modulation operations on each of the N4 to-be-phase-modulated symbols, the N4 second symbols corresponding to the N4 to-be-phase-modulated symbols.

11. The device according to claim 9, wherein when executed by the one or more processors, the program instructions further cause the device to:
obtain N31 phase modulation bits and perform phase bit encoding on the N31 phase modulation bits to obtain the N3 second bits, wherein the N3 second bits comprise N4 target phase modulation bits.

12. The device according to claim 10, wherein when executed by the one or more processors, the program instructions further cause the device to:
obtain N31 phase modulation bits and perform phase bit encoding on the N31 phase modulation bits to obtain the N3 second bits, wherein the N3 second bits comprise N4 target phase modulation bits.

13. The device according to claim 11, wherein when executed by the one or more processors, the program instructions further cause the device to:
determine, based on the preset signal power, a quantity N3 of second bits used for phase modulation.

14. The device according to claim 12, wherein when executed by the one or more processors, the program instructions further cause the device to:
determine, based on the preset signal power, a quantity N3 of second bits used for phase modulation.

15. The device according to claim 14, wherein when executed by the one or more processors, the program instructions further cause the device to:
determine, based on the preset signal power and signal powers corresponding to symbols output through DM encoding, a quantity N4 of to-be-phase-modulated symbols;
determine a bit quantity of a target phase modulation bit corresponding to each of the N4 to-be-phase-modulated symbols, wherein the target phase modulation bit is used to determine a target phase corresponding to the to-be-phase-modulated symbol from a preset target phase set, and wherein to-be-phase-modulated symbols having different signal powers correspond to different target phase sets; and
determine the quantity N3 of the second bits used for phase modulation based on the quantity N4 of the to-be-phase-modulated symbols and the bit quantity of the target phase modulation bit corresponding to each of the N4 to-be-phase-modulated symbols.

16. The device according to claim 15, wherein when executed by the one or more processors, the program instructions further cause the device to:
perform, on any to-be-phase-modulated symbol i in the N4 to-be-phase-modulated symbols, the following operations for determining the bit quantity of the target phase modulation bit;
determining a quantity D of types of phases in the target phase set corresponding to the to-be-phase-modulated symbol i; and
determining, based on the quantity D of types of phases, the bit quantity of the target phase modulation bit corresponding to the to-be-phase-modulated symbol i, wherein the target phase modulation bit comprises one or more second bits that are in the N3 second bits and that are used to determine a target phase corresponding to a specific to-be-phase-modulated symbol, and wherein the bit quantity of the target phase modulation bit is equal to a value obtained by rounding up $\log_2(D)$; and
obtain, by performing, on each of the N4 to-be-phase-modulated symbols, the operations for determining the bit quantity of the target phase modulation bit, the bit quantity of the target phase modulation bit corresponding to the to-be-phase-modulated symbol.

17. The device according to claim 15, wherein when executed by the one or more processors, the program instructions further cause the device to:

perform FEC encoding based on the N5 BL encoded output bits and N7 quadrant selection bits to obtain the N6 FEC redundant bits.

18. The device according to claim 16, wherein when executed by the one or more processors, the program instructions further cause the device to:
perform FEC encoding based on the N5 BL encoded output bits and N7 quadrant selection bits, to obtain the N6 FEC redundant bits.

19. The device according to claim 18, wherein when executed by the one or more processors, the program instructions further cause the device to:
determine N8 target quadrant selection bits based on the N6 FEC redundant bits and the N7 quadrant selection bits, wherein N8=N6+N7; and
perform, based on the N8 target quadrant selection bits, QAM mapping on the N5 BL encoded output bits to obtain the N2 target QAM signals.

20. A non-transitory computer-readable storage medium comprising instructions which, when executed by one or more processors, cause the one or more processors to perform operations comprising:

performing distribution matching (DM) encoding on N1 first bits to obtain N2 first symbols, wherein signal powers corresponding to the N2 first symbols comprise at least a first power and a second power;
determining N4 to-be-phase-modulated symbols whose signal powers are equal to a preset signal power from the N2 first symbols, and performing phase modulation on the N4 to-be-phase-modulated symbols based on N3 second bits to obtain N4 second symbols, wherein some or all of signal powers corresponding to the N2 first symbols are equal to the preset signal power;
performing binary labeling (BL) encoding on the N4 second symbols and N2-N4 first symbols in the N2 first symbols except the N4 to-be-phase-modulated symbols to obtain N5 BL encoded output bits;
performing forward error correction (FEC) encoding on the N5 BL encoded output bits to obtain N6 FEC redundant bits; and
performing quadrature amplitude modulation (QAM) mapping based on the N6 FEC redundant bits and the N5 BL encoded output bits to obtain N2 target QAM signals.

* * * * *

UNITED STATES PATENT AND TRADEMARK OFFICE
CERTIFICATE OF CORRECTION

PATENT NO. : 11,349,698 B2
APPLICATION NO. : 17/357605
DATED : May 31, 2022
INVENTOR(S) : Huang et al.

Page 1 of 1

It is certified that error appears in the above-identified patent and that said Letters Patent is hereby corrected as shown below:

In the Claims

Column 24/Line 35 (Approx.) - In Claim 6, delete "bit;" and insert -- bit: --.

Column 26/Line 46 - In Claim 16, delete "bit;" and insert -- bit: --.

Signed and Sealed this
Twenty-fifth Day of October, 2022

Katherine Kelly Vidal
*Director of the United States Patent and Trademark Office*